(12) United States Patent
Nakano et al.

(10) Patent No.: US 9,351,388 B2
(45) Date of Patent: May 24, 2016

(54) TARGET GENERATION DEVICE AND EXTREME ULTRAVIOLET LIGHT GENERATION APPARATUS

(71) Applicant: GIGAPHOTON INC., Tochigi (JP)

(72) Inventors: Masaki Nakano, Oyama (JP); Osamu Wakabayashi, Oyama (JP)

(73) Assignee: GIGAPHOTON INC., Tochigi (JP)

( * ) Notice: Subject to any disclaimer, the term of this patent is extended or adjusted under 35 U.S.C. 154(b) by 0 days.

(21) Appl. No.: 14/887,450

(22) Filed: Oct. 20, 2015

(65) Prior Publication Data

US 2016/0044773 A1 Feb. 11, 2016

Related U.S. Application Data

(63) Continuation of application No. 14/215,527, filed on Mar. 17, 2014, now Pat. No. 9,198,272.

(30) Foreign Application Priority Data

Mar. 22, 2013 (JP) ................. 2013-060370

(51) Int. Cl.
| | | |
|---|---|---|
| H05G 2/00 | (2006.01) | |
| H01L 21/66 | (2006.01) | |
| H01L 21/268 | (2006.01) | |
| G03F 7/20 | (2006.01) | |
| B05B 17/06 | (2006.01) | |
| B05B 12/02 | (2006.01) | |

(52) U.S. Cl.
CPC .............. *H05G 2/006* (2013.01); *B05B 12/02* (2013.01); *B05B 17/0607* (2013.01); *B05B 17/0615* (2013.01); *G03F 7/70033* (2013.01); *G03F 7/70041* (2013.01); *G03F 7/7085* (2013.01); *H01L 21/268* (2013.01); *H01L 22/10* (2013.01); *H05G 2/003* (2013.01); *H05G 2/008* (2013.01)

(58) Field of Classification Search
CPC .... B05B 12/02; B05B 9/002; B05B 17/0607; B05B 17/0615
See application file for complete search history.

(56) References Cited

U.S. PATENT DOCUMENTS

| | | | |
|---|---|---|---|
| 7,164,144 B2 | 1/2007 | Partlo et al. | |
| 7,173,267 B2 | 2/2007 | Nakano | |
| 7,897,947 B2 | 3/2011 | Vaschenko | |
| 8,158,960 B2 | 4/2012 | Vaschenko et al. | |
| 8,513,629 B2 | 8/2013 | Rajyaguru et al. | |
| 8,525,140 B2 | 9/2013 | Abe et al. | |
| 8,829,477 B2 * | 9/2014 | Rajyaguru | G03F 7/70033 250/504 R |
| 9,072,152 B2 * | 6/2015 | Wakabayashi | H05G 2/008 |
| 9,072,153 B2 * | 6/2015 | Wakabayashi | H05G 2/008 |
| 9,198,272 B2 * | 11/2015 | Nakano | B05B 17/0615 |
| 2007/0001130 A1 | 1/2007 | Bykanov et al. | |
| 2012/0305811 A1 * | 12/2012 | Wakabayashi | H05G 2/008 250/504 R |
| 2014/0084183 A1 * | 3/2014 | Wakabayashi | H05G 2/008 250/492.1 |

* cited by examiner

*Primary Examiner* — Jack Berman

(74) *Attorney, Agent, or Firm* — Studebaker & Brackett PC

(57) ABSTRACT

A target supply device may include a reservoir configured to hold a target material in its interior in liquid form, a vibrating element configured to apply vibrations to the reservoir, a target sensor configured to detect droplets of the target material outputted from the reservoir, a control unit configured to set parameters based on a result of the detection performed by the target sensor, a function generator configured to generate an electrical signal having a waveform based on the parameters, and a power source configured to apply a driving voltage to the vibrating element in accordance with the electrical signal.

20 Claims, 12 Drawing Sheets

TARGET GENERATION DEVICE AND EXTREME ULTRAVIOLET LIGHT GENERATION APPARATUS

CROSS-REFERENCE TO A RELATED APPLICATION

The present application is a continuation of U.S. patent application Ser. No. 14/215,527, filed Mar. 17, 2014, which claims priority from Japanese Patent Application No. 2013-060370, filed Mar. 22, 2013, the entire contents of which all are incorporated herein by reference.

The present disclosure relates to target supply devices and extreme ultraviolet light generation apparatuses.

RELATED ART

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 60 nm to 45 nm, and further, microfabrication with feature sizes of 32 nm or less will be required. In order to meet the demand for microfabrication with feature sizes of 32 nm or less, for example, an exposure apparatus is needed in which a system for generating EUV light at a wavelength of approximately 13 nm is combined with a reduced projection reflective optical system.

Three kinds of systems for generating EUV light are known in general, which include a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used to generate plasma.

SUMMARY

A target supply device according to an aspect of the present disclosure may include a reservoir, a vibrating element, a target sensor, a control unit, a function generator, and a power source. The reservoir may be configured to hold a target material in liquid form. The vibrating element may be configured to apply vibrations to the reservoir. The target sensor may be configured to detect droplets of the target material outputted from the reservoir. The control unit may be configured to set parameters based on a result of the detection performed by the target sensor. The function generator may be configured to generate an electrical signal having a waveform based on the parameters. The power source may be configured to apply a driving voltage to the vibrating element in accordance with the electrical signal.

An extreme ultraviolet light generation apparatus according to another aspect of the present disclosure may include a chamber, an optical system, and a target supply device. The chamber may be provided with a through-hole. The optical system may be configured to conduct a pulse laser beam to a predetermined region in the chamber via the through-hole. The target supply device may include a reservoir, a vibrating element, a target sensor, a control unit, a function generator, and a power source. The reservoir may be configured to hold a target material in its interior in liquid form. The vibrating element may be configured to apply vibrations to the reservoir. The target sensor may be configured to detect droplets of the target material outputted from the reservoir. The control unit may be configured to set parameters based on a result of the detection performed by the target sensor. The function generator may be configured to generate an electrical signal having a waveform based on the parameters. The power source may be configured to apply a driving voltage to the vibrating element in accordance with the electrical signal. The target supply device may be configured to supply the droplets of the target material to the predetermined region in the chamber.

BRIEF DESCRIPTION OF THE DRAWINGS

Hereinafter, selected embodiments of the present disclosure will be described with reference to the accompanying drawings.

DETAILED DESCRIPTION

Figure 1:
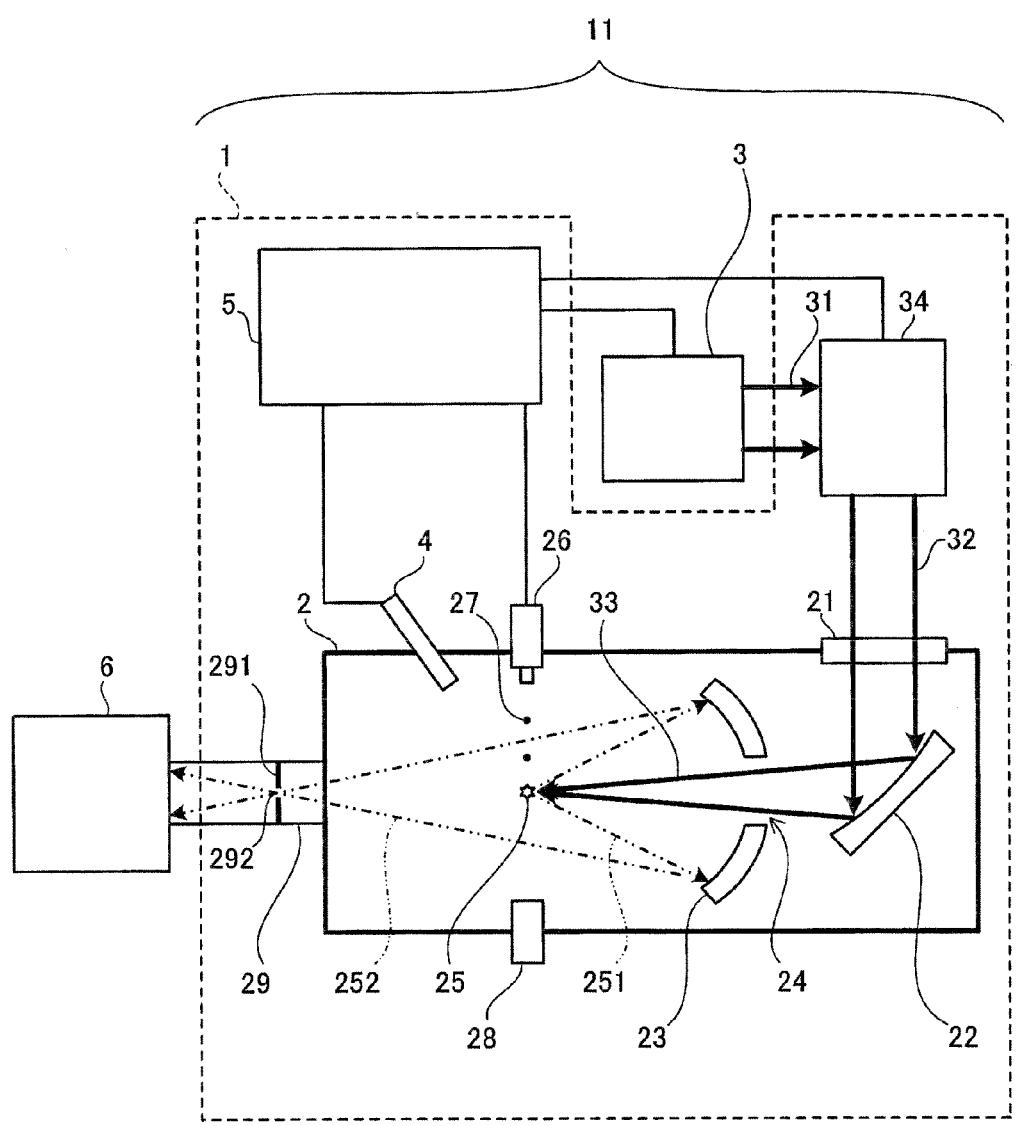
FIG. 1 schematically illustrates an exemplary configuration of an LPP type EUV light generation system.

Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Note that like elements are referenced by like reference numerals and characters, and duplicate descriptions thereof will be omitted herein.

Contents
1. Overview
2. Terms
3. Overview of EUV Light Generation System
   3.1 Configuration
   3.2 Operation
4. Target Supply Device in Which Electrical Signals Undergo Feedback Control
   4.1 Configuration
   4.2 Operation
   4.3 Details of Target Sensor
   4.4 Example of Waveform Generated by Function Generator
   4.5 Setting of Parameters Based on Detection Result from Target Sensor
   4.5.1 Main Flow
   4.5.2 Target Measurement Process (S1600/S2200)
   4.5.3 Measurement Result Evaluation Process (S1700/S2300)
   4.5.4 Parameter Changing Process (S2000)
5. Target Supply Device Including Image Sensor
   5.1 Configuration
   5.2 Operation
   5.3 Target Measurement Process
6. Waveform and Parameter Examples
7. Configuration of Controller 1. Overview In an LPP-type EUV light generation apparatus, a target supply device may generate a droplet of a target material and cause the droplet to reach a plasma generation region in a chamber. By irradiating the target material droplet with a pulse laser beam at the point in time when the target material droplet reaches the plasma generation region, the target material can be turned into plasma and EUV light can be radiated from the plasma.

The target supply device may include a reservoir for holding the target material in liquid form in its interior and a vibrating element such as a piezoelectric element configured to apply vibrations to the reservoir. A jet of the liquid target material may be outputted from the reservoir due to a difference between a pressure in the interior of the reservoir and a pressure in the interior of the chamber.

When the vibrating element applies vibrations to the reservoir, the vibrations may be transmitted to the target material jet, and the target material droplets may be generated according to the following principles. That is, when a jet having a diameter d and flowing at a velocity v is disturbed by applying vibrations at a frequency f, a group of droplets having substantially uniform sizes can be repeatedly formed at the frequency f in the case where the frequency f meets a predetermined condition. At this time, the frequency f may be referred to as the "Rayleigh frequency".

It is desirable for the target material droplets to be generated at a stable interval in order for the EUV light generation apparatus to generate stable EUV light. To that end, it is desirable for optimal parameters to be set for a driving voltage applied to the vibrating element. However, it is possible that the target material droplets will not be generated at a stable interval even if the target material droplets are generated by applying driving voltages having the same waveform to the vibrating element.

According to an aspect of the present disclosure, the target supply device may include a target sensor configured to detect droplets of the target material outputted from the reservoir and a control unit configured to set parameters based on a result of the detection performed by the target sensor. A function generator may generate an electrical signal having a waveform based on the parameters, and a power source may apply a driving voltage to the vibrating element in accordance with the electrical signal. According to this target supply device, the target material droplets can be generated in a stable manner.

The control unit may set modulation parameters and parameters of a first periodic function. The function generator may generate the electrical signal by performing angular modulation by a predetermined second periodic function using the modulation parameters, with the first periodic function serving as a carrier wave.

2. Terms

Several terms used in the present application will be described hereinafter.

A "target" may be a droplet of the target material.

A "trajectory" of a target may be an ideal path of a target outputted from a target supply device, or may be a path of a target according to the design of a target supply device.

A "path" of the target may also be the actual path of the target outputted from the target supply device.

A "target control unit 51" and a "target interval measurement unit 55" can both correspond to a "control unit" according to the present disclosure.

A "vibrating element power source 58" can correspond to a "power source" according to the present disclosure.

3. Overview of EUV Light Generation System 3.1 Configuration

FIG. 1 schematically illustrates an exemplary configuration of an LPP type EUV light generation system. An EUV light generation apparatus 1 may be used with at least one laser apparatus 3. Hereinafter, a system that includes the EUV light generation apparatus 1 and the laser apparatus 3 may be referred to as an EUV light generation system 11. As shown in FIG. 1 and described in detail below, the EUV light generation system 11 may include a chamber 2 and a target supply device 26. The chamber 2 may be sealed airtight. The target supply device 26 may be mounted onto the chamber 2, for example, to penetrate a wall of the chamber 2. A target material to be supplied by the target supply device 26 may include, but is not limited to, tin, terbium, gadolinium, lithium, xenon, or any combination thereof.

The chamber 2 may have at least one through-hole or opening formed in its wall, and a pulse laser beam 32 may travel through the through-hole/opening into the chamber 2. Alternatively, the chamber 2 may have a window 21, through which the pulse laser beam 32 may travel into the chamber 2. An EUV collector mirror 23 having a spheroidal surface may, for example, be provided in the chamber 2. The EUV collector mirror 23 may have a multi-layered reflective film formed on the spheroidal surface thereof. The reflective film may include a molybdenum layer and a silicon layer, which are alternately laminated. The EUV collector mirror 23 may have a first focus and a second focus, and may be positioned such that the first focus lies in a plasma generation region 25 and the second focus lies in an intermediate focus (IF) region 292 defined by the specifications of an external apparatus, such as an exposure apparatus 6. The EUV collector mirror 23 may have a through-hole 24 formed at the center thereof so that a pulse laser beam 33 may travel through the through-hole 24 toward the plasma generation region 25.

The EUV light generation system 11 may further include an EUV light generation controller 5 and a target sensor 4. The target sensor 4 may have an imaging function and detect at least one of the presence, path, position, and speed of a target 27.

Further, the EUV light generation system 11 may include a connection part 29 for allowing the interior of the chamber 2 to be in communication with the interior of the exposure apparatus 6. A wall 291 having an aperture 293 may be provided in the connection part 29. The wall 291 may be positioned such that the second focus of the EUV collector mirror 23 lies in the aperture 293 formed in the wall 291.

The EUV light generation system 11 may also include a laser beam direction control unit 34, a laser beam focusing mirror 22, and a target collector 28 for collecting targets 27. The laser beam direction control unit 34 may include an optical element (not separately shown) for defining the direction into which the pulse laser beam 32 travels and an actuator (not separately shown) for adjusting the position and the orientation or posture of the optical element.

3.2 Operation

With continued reference to FIG. 1, a pulse laser beam 31 outputted from the laser apparatus 3 may pass through the laser beam direction control unit 34 and be outputted therefrom as the pulse laser beam 32 after having its direction optionally adjusted. The pulse laser beam 32 may travel through the window 21 and enter the chamber 2. The pulse laser beam 32 may travel inside the chamber 2 along at least one beam path from the laser apparatus 3, be reflected by the laser beam focusing mirror 22, and strike at least one target 27 as a pulse laser beam 33.

The target supply device 26 may be configured to output the target(s) 27 toward the plasma generation region 25 in the chamber 2. The target 27 may be irradiated with at least one pulse of the pulse laser beam 33. Upon being irradiated with the pulse laser beam 33, the target 27 may be turned into plasma, and rays of light 251 including EUV light may be emitted from the plasma. At least the EUV light included in the light 251 may be reflected selectively by the EUV collector mirror 23. EUV light 252, which is the light reflected by the EUV collector mirror 23, may travel through the intermediate focus region 292 and be outputted to the exposure apparatus 6. Here, the target 27 may be irradiated with multiple pulses included in the pulse laser beam 33.

The EUV light generation controller 5 may be configured to integrally control the EUV light generation system 11. The EUV light generation controller 5 may be configured to process image data of the target 27 captured by the target sensor 4. Further, the EUV light generation controller 5 may be configured to control at least one of: the timing when the target 27 is outputted and the direction into which the target 27 is outputted. Furthermore, the EUV light generation controller 5 may be configured to control at least one of: the timing when the laser apparatus 3 oscillates, the direction in which the pulse laser beam 33 travels, and the position at which the pulse laser beam 33 is focused. It will be appreciated that the various controls mentioned above are merely examples, and other controls may be added as necessary.

Figure 2:
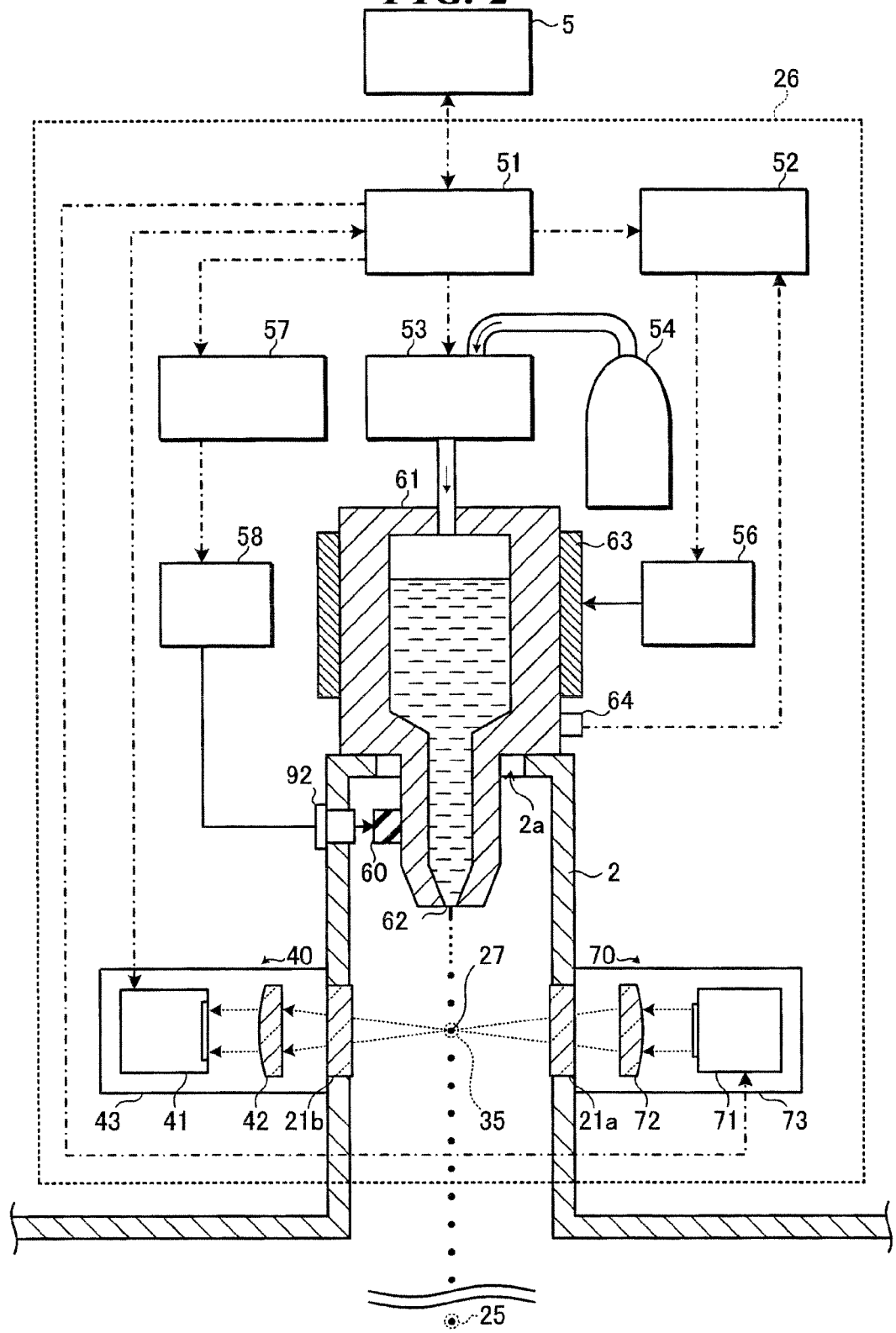
FIG. 2 is a partial cross-sectional view illustrating the configuration of a target supply device according to a first embodiment.

4. Target Supply Device in Which Electrical Signals Undergo Feedback Control 4.1 Configuration FIG. 2 is a partial cross-sectional view illustrating the configuration of the target supply device 26 according to a first embodiment. As shown in FIG. 2, the target supply device 26 may include a reservoir 61, a target control unit 51, a temperature control unit 52, a pressure adjuster 53, an inert gas bottle 54, and a heater power source 56. The target supply device 26 may further include a function generator 57, a vibrating element power source 58, a light-emitting section 70, and a target sensor 40.

The reservoir 61 may hold, in its interior, a target material including tin, for example, in a melted state. A heater 63 may be attached to the reservoir 61 in order to melt the target material. A through-hole 2a may be formed in a wall of the chamber 2. Part of the reservoir 61 may pass through the through-hole 2a, and a nozzle opening 62 of the reservoir 61 may be located within the chamber 2. A sealing member (not shown) may be disposed between a wall surface of the chamber 2 in the periphery of the through-hole 2a, and the reservoir 61. This sealing member may form an airtight seal between the wall surface of the chamber 2 in the periphery of the through-hole 2a, and the reservoir 61.

The target control unit 51 may be configured to be capable of receiving an EUV control signal from the EUV light generation controller 5. The target control unit 51 may be connected to the temperature control unit 52, the pressure adjuster 53, the function generator 57, a photodetector 41, and a light source 71 via respective signal lines.

The temperature control unit 52 may be connected to the heater power source 56 and a temperature sensor 64 via respective signal lines. The heater power source 56 may be electrically connected to the heater 63 via a wire. The temperature sensor 64 may be attached to the reservoir 61.

The inert gas bottle 54 may be connected to the pressure adjuster 53 via a pipe. The pressure adjuster 53 may communicate with the interior of the reservoir 61 via another pipe. An inert gas may be supplied to the interior of the reservoir GI from the inert gas bottle 54 via these pipes.

The function generator 57 may be connected to the vibrating element power source 58 via a signal line. A vibrating element 60 may be attached to the reservoir 61. The vibrating element 60 may be attached to the reservoir 61 in the vicinity of the nozzle opening 62. The vibrating element 60 may include a piezoelectric material such as PZT (lead zirconate titanate) and an electrode (not shown) attached to the piezoelectric material. The vibrating element power source 58 may be electrically connected to the electrode of the vibrating element 60 via a wire. The wire that connects the vibrating element power source 58 and the vibrating element 60 may pass through the wall of the chamber 2 via an inlet terminal 92. Vibrations may be applied to the reservoir 61 by the vibrating element power source 58 applying a driving voltage to the vibrating element 60.

The target sensor 40 and the light-emitting section 70 may be attached to the chamber 2. The target sensor 40 may include the photodetector 41, a light-receiving optical system 42, and a plate 43. The plate 43 may be anchored to the outside of the chamber 2, and the photodetector 41 and the light-receiving optical system 42 may each be anchored to the plate 43. The light-emitting section 70 may include the light source 71, an illuminating optical system 72, and a plate 73. The plate 73 may be anchored to the outside of the chamber 2, and the light source 71 and the illuminating optical system 72 may each be anchored to the plate 73.

The target sensor 40 and the light-emitting section 70 may be disposed opposite to each other on either side of the trajectory of the targets 27. Windows 21a and 21b may be provided in the chamber 2. The window 21a may be positioned between the light-emitting section 70 and the trajectory of the targets 27. The window 21b may be positioned between the trajectory of the targets 27 and the target sensor 40.

4.2 Operation

The temperature control unit 52 may control the value of a current applied to the heater 63 by the heater power source 56 based on a detection value detected by the temperature sensor 64 so as to maintain the temperature at a target temperature specified by the target control unit 51. The heater 63 may be heated by the current, and as a result, the target material held within the reservoir 61 may be heated to a temperature greater than or equal to the melting point of the target material.

The pressure adjuster 53 may adjust the pressure of the inert gas supplied to the interior of the reservoir 61 from the inert gas bottle 54 based on a control signal outputted from the target control unit 51. The inert gas introduced into the reservoir 61 may pressurize the melted target material within the reservoir 61. The inert gas may pressurize the target material, and a jet 66 (mentioned later) of the liquid target material may be outputted from the nozzle opening 62 of the reservoir 61 as a result.

The function generator 57 may, based on parameters and the control signal outputted from the target control unit 51, generate an electrical signal having a waveform based on the stated parameters. Based on the electrical signal outputted from the function generator 57, the vibrating element power source 58 may apply, to the vibrating element 60, a driving voltage having a similar waveform that corresponds to the electrical signal. The vibrating element 60 may extend and contract cyclically in response thereto, applying vibrations to the reservoir 61 as a result. The vibrations applied to the reservoir 61 may be transmitted to the jet 66 of the target material outputted from the nozzle opening 62, causing the jet 66 to be detached in droplet form and turning the jet 66 into a plurality of the targets 27.

The targets 27 outputted into the chamber 2 may be supplied to the plasma generation region 25 within the chamber 2. The EUV light generation controller 5 may control the laser apparatus 3 shown in FIG. 1 so that the targets 27 outputted from the target supply device 26 are irradiated with a pulse laser beam. The EUV light generation controller 5 may control the laser apparatus 3 so that the plasma generation region 25 is irradiated with the pulse laser light at the timing at which the target 27 reaches the plasma generation region 25.

The light source 71 may emit light continuously based on a control signal outputted from the target control unit 51. The illuminating optical system 72 may focus the light outputted from the light source 71 at a region 35 that includes a predetermined position in the trajectory of the targets 27 and the periphery of that position. Through this, the light-emitting section 70 may illuminate the region 35 via the window 21a. The light-receiving optical system 42 may conduct the light outputted from the light-emitting section 70 to a light-receiving surface of the photodetector 41.

In the case where a target 27 has passed through the region 35 illuminated by the light-emitting section 70, part of the light outputted from the light-emitting section 70 may be blocked by the target 27 before the light reaches the target sensor 40. As a result, the amount of light incident on the photodetector 41 of the target sensor 40 can drop. The photodetector 41 may detect the change in the amount of incident light and output a target detection signal Vd (mentioned later).

4.3 Details of Target Sensor

Figure 3:
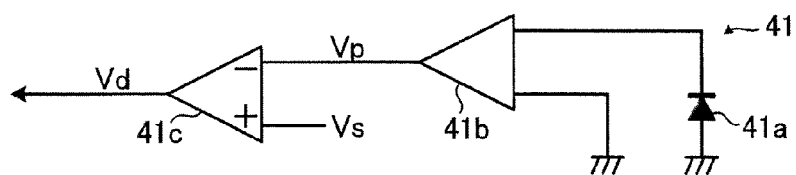
FIG. 3 is a circuit diagram of a photodetector shown in FIG. 2.

FIG. 3 is a circuit diagram of the photodetector 41 shown in FIG. 2. As shown in FIG. 3, the photodetector 41 may include a light-receiving element 41a, an amplifier 41b, and a comparator 41c. The light-receiving element 41a (a photodiode, for example) may be capable of outputting a voltage signal corresponding to an amount of incident light from the exterior. The light-receiving element 41a may be connected to an input terminal of the amplifier 41b. The amplifier 41b may amplify the voltage signal outputted by the light-receiving element 41a and output an output signal Vp. An output terminal of the amplifier 41b may be connected to a negative-side input terminal of the comparator 41c. A constant reference potential Vs may be applied to a positive-side input terminal of the comparator 41c.

The output signal Vp of the amplifier 41b can be at a lower potential when the target 27 is present in the region 35 illuminated by the light-emitting section 70 than when the target 27 is not present in the region 35 illuminated by the light-emitting section 70. This can be because the light-receiving element 41a receives less light when the target 27 is present in the region 35 illuminated by the light-emitting section 70. The potential of the output signal Vp of the amplifier 41b can return to its original potential after the target 27 has passed the region 35 illuminated by the light-emitting section 70. The reference potential Vs may be set to be between the potential of the output signal Vp when the target 27 is not present in the region 35 illuminated by the light-emitting section 70 and the potential of the output signal Vp when the target 27 is present in the region 35 illuminated by the light-emitting section 70.

The target detection signal Vd outputted from the comparator 41c can be at a first potential while the output signal Vp is at a higher potential than the reference potential Vs. When the output signal Vp reaches a lower potential than the reference potential Vs, the target detection signal Vd can be at a second potential. The photodetector 41 may output the target detection signal Vd to the target control unit 51 illustrated in FIG. 2 via a buffer circuit (not shown).

4.4 Example of Waveform Generated by Function Generator

Figure 4A:
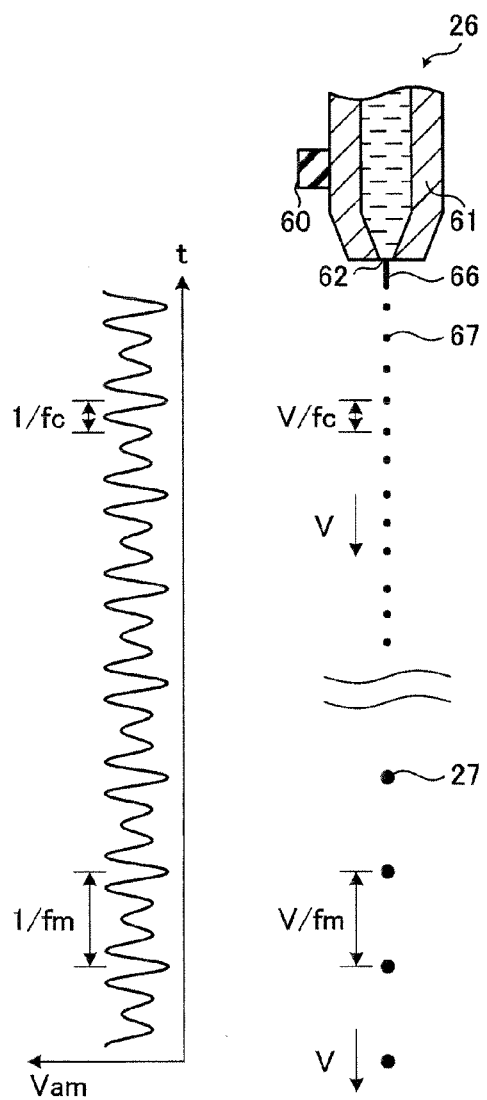
FIGS. 4A to 4D schematically illustrate examples of waveforms of electrical signals generated by a function generator and states of targets in the case where AC voltages have been applied to a vibrating element based on the electrical signals.
Figure 4B:
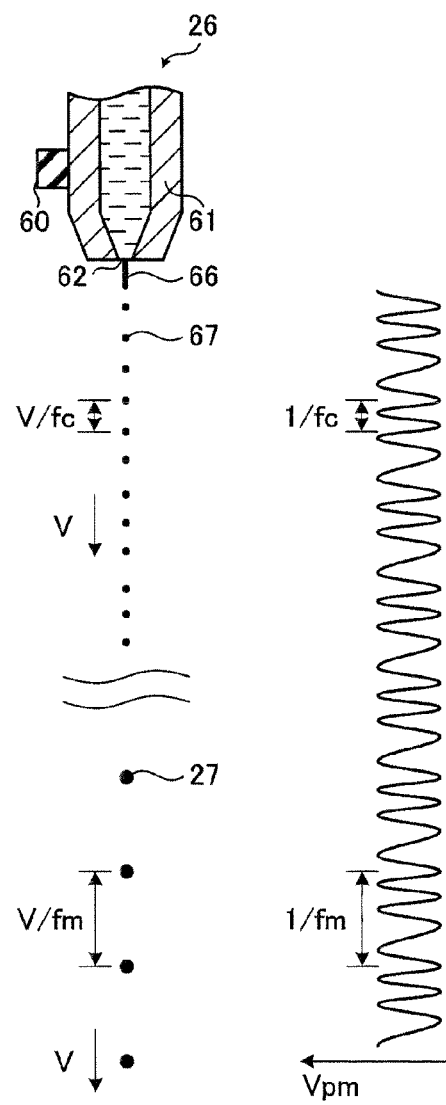
Figure 4C:
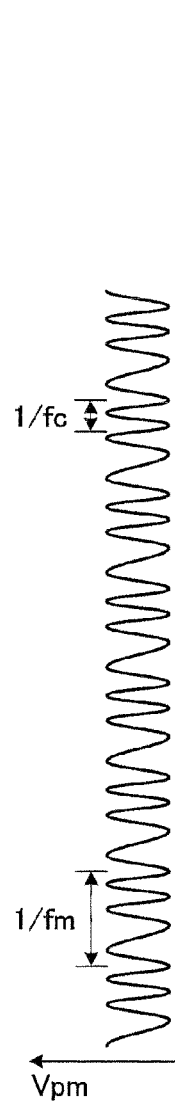
Figure 4D:
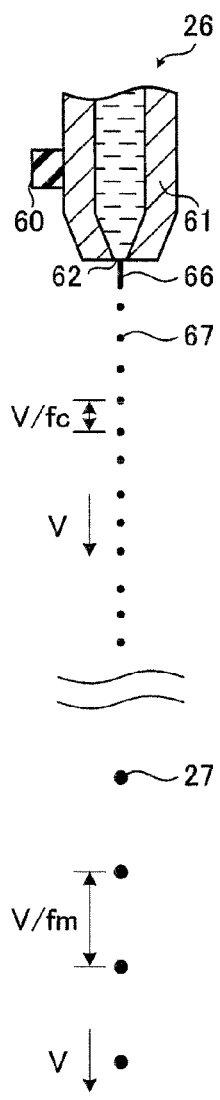

FIGS. 4A and 4C illustrate examples of the waveforms of the electrical signal generated by the function generator 57. FIGS. 4B and 4D schematically illustrate states of the targets 27 in the case where driving voltages have been applied to the vibrating element 60 based on the electrical signals illustrated in FIGS. 4A and 4C, respectively. FIGS. 4A and 4B illustrate an example of amplitude modulation, whereas FIGS. 4C and 4D illustrate an example of phase modulation.

In the present disclosure, the function generator 57 may receive modulation parameters and parameters of a first periodic function from the target control unit 51, and may generate an electrical signal having a waveform based on those parameters. The function generator 57 may generate, with the first periodic function serving as a carrier wave, an electrical signal having a waveform that has undergone analog modulation based on a predetermined second periodic function using the aforementioned modulation parameters.

The analog modulation may be amplitude modulation (AM modulation) or angular modulation. The angular modulation may be frequency modulation (FM modulation) or phase modulation (PM modulation).

A first periodic function Vc(t) that corresponds to the carrier wave can be expressed by the following trigonometric function.

$$Vc(t) = Vcm \cdot \sin(2\pi \cdot fc \cdot t)$$

Here, Vcm may represent the amplitude of the first periodic function, whereas fc may represent the frequency of the first periodic function.

A modulated wave Vam(t) generated through the amplitude modulation can be expressed by the following formula.

$$Vam(t) = \{Vcm + \delta V \cdot Vm(t) + \phi\} \cdot \sin(2\pi \cdot fc \cdot t)$$

A modulated wave Vfm(t) generated through the frequency modulation can be expressed by the following formula.

$$Vfm(t) = Vcm \cdot \sin\{2\pi \cdot fc \cdot t + \delta f \cdot \int Vm(t)dt + \phi\}$$

A modulated wave Vpm(t) generated through the phase modulation can be expressed by the following formula.

$$Vpm(t) = Vcm \cdot \sin\{2\pi \cdot fc \cdot t + \delta\theta \cdot Vm(t) + \phi\}$$

Here, Vm(t) may be the second periodic function that is a modulated wave, and $\delta V$, $\delta f$, $\delta\theta$, and $\phi$ may be modulation parameters. δV may be a peak amplitude deviation in the amplitude modulation, δf may be a peak frequency deviation in the frequency modulation, δθ may be a peak phase deviation in the phase modulation, and φ may be a phase difference between the first periodic function and the second periodic function.

The second periodic function Vm(t) may be expressed by the following trigonometric function, for example.

$$Vm(t)=\cos(2\pi \cdot fm \cdot t)$$

Here, fm may be the frequency of the second periodic function. The frequency fm of the second periodic function may be the same as the frequency fc of the first periodic function or may be lower than the frequency fc of the first periodic function.

FIG. 4A illustrates an example of the modulated wave Vam(t) generated through the amplitude modulation. The modulated wave Vam(t) generated through amplitude modulation may be a wave generated by changing the amplitude at a 1/fm cycle using the second periodic function, with the first periodic function having a 1/fc cycle serving as the carrier wave. When the vibrating element power source 58 applies the driving voltage to the vibrating element 60 based on the electrical signal having the modulated wave Vam(t) waveform, the jet 66 outputted from the nozzle opening 62 of the target supply device 26 can be detached as fine droplets 67 at a 1/fc cycle. These fine droplets 67 can have mutually different velocities due to changes in the amplitude of the modulated wave Vam(t) based on the 1/fm cycle. The target 27 can be generated as a combination of a plurality of the fine droplets 67 due to this velocity difference. When an average velocity of the plurality of fine droplets 67 is taken as V, a distance between respective fine droplets 67 can be approximately V/fc, and a distance between targets 27 that are combinations of the plurality of fine droplets 67 can be V/fm.

For example, in the case where the diameter of the nozzle opening 62 is 6 to 10 μm and an average velocity V of the targets 27 is 50 m/s, the various parameters may be set as follows.

frequency fm of second periodic function: 100 kHz
peak amplitude deviation δV: 0.5
frequency fc of first periodic function: 900 kHz to 1600 kHz phase difference φ: 0°

The parameters at which the targets 27 can be generated in a stable manner may be selected within such a range.

FIG. 4C illustrates an example of the modulated wave Vpm(t) generated through the phase modulation. The modulated wave Vpm(t) generated through phase modulation may be a wave generated by changing the phase at a 1/fm cycle using the second periodic function, with the first periodic function having a 1/fc cycle serving as the carrier wave. When the vibrating element power source 58 applies the driving voltage to the vibrating element 60 based on the electrical signal having the modulated wave Vpm(t) waveform, the jet 66 outputted from the nozzle opening 62 of the target supply device 26 can be detached as fine droplets 67 at a 1/fc cycle. These fine droplets 67 can have mutually different velocities due to changes in the phase of the modulated wave Vpm (t) based on the 1/fm cycle. The target 27 can be generated as a combination of a plurality of the fine droplets 67 due to this velocity difference. When the average velocity of the plurality of fine droplets 67 is taken as V, the distance between respective fine droplets 67 can be approximately V/fc, and the distance between targets 27 that are combinations of the plurality of fine droplets 67 can be V/fm.

For example, in the case where the diameter of the nozzle opening 62 is 6 to 10 μm and an average velocity V of the targets 27 is 50 m/s, the various parameters may be set as follows.

frequency fm of second periodic function: 100 kHz
peak phase deviation δθ: 100° to 180°
frequency fc of first periodic function: 900 kHz to 1600 kHz phase difference φ: 0°

The parameters at which the targets 27 can be generated in a stable manner may be selected within such a range.

With respect to amplitude modulation and phase modulation, generating the targets 27 while changing the parameters within the aforementioned ranges makes it possible to select parameters through which the targets 27 can be generated in a stable manner in both the amplitude modulation and the phase modulation. Although the same applies to the stability of the path of the targets 27 in a direction perpendicular to the trajectory of the targets 27, phase modulation is superior to amplitude modulation with respect to the stability of the intervals between the targets 27 in a direction parallel to the trajectory of the targets 27. Aside from modulated wave integration, frequency modulation is the same as phase modulation, and it is therefore thought that the targets 27 can be generated in a stable manner when using frequency modulation, in the same manner as when using phase modulation.

Figure 5:
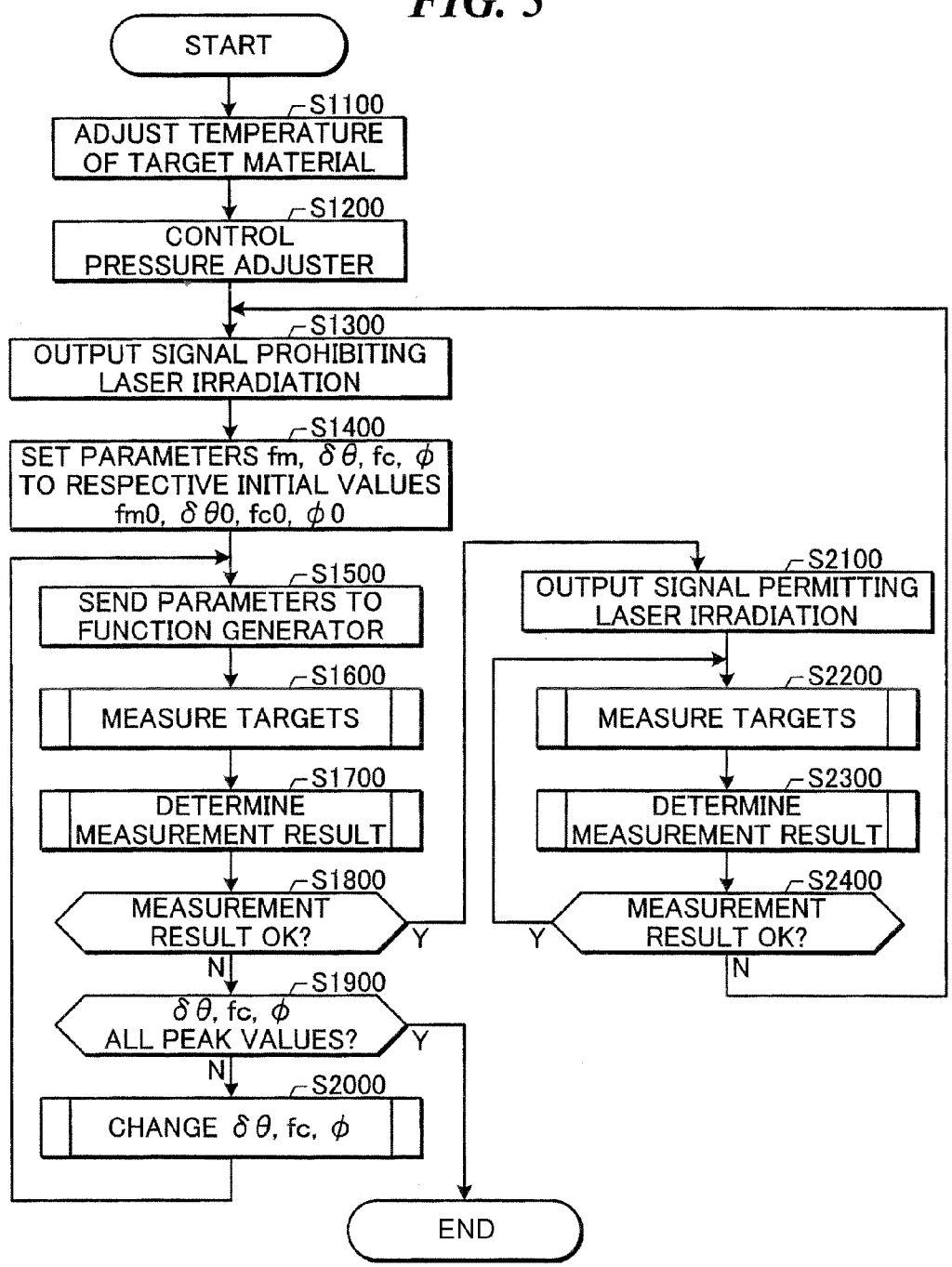
FIG. 5 is a flowchart illustrating an example of operations performed by a target control unit shown in FIG. 2.

4.5 Setting of Parameters Based on Detection Result from Target Sensor 4.5.1 Main Flow FIG. 5 is a flowchart illustrating an example of operations performed by the target control unit 51 shown in FIG. 2. Based on the output of the photodetector 41, the target control unit 51 may set the parameters for the waveform of the electrical signal used to generate the driving voltage applied to the vibrating element 60 as follows. Note that the following describes a case of setting the parameters for carrying out phase modulation according to the second periodic function, with the first periodic function serving as the carrier wave. In the case where parameters are to be set for amplitude modulation or frequency modulation, the parameters that are set will be different, but the same process as the process for setting the parameters for phase modulation may be carried out.

First, the target control unit 51 may output a control signal to the temperature control unit 52 so as to adjust the temperature of the target material (S1100). The temperature control unit 52 may carry out control in accordance with this control signal, and may adjust the temperature of the target material held in the reservoir 61 to a predetermined temperature greater than or equal to the melting point of the target material.

Next, the target control unit 51 may output a control signal to the pressure adjuster 53 so as to adjust the pressure of the inert gas supplied from the inert gas bottle 54 to the interior of the reservoir 61 (S1200). The inert gas may pressurize the target material, and the jet 66 (see FIG. 4D) of the liquid target material may be outputted from the nozzle opening 62 of the reservoir 61 as a result.

Next, the target control unit 51 may output a signal indicating that laser irradiation is prohibited to the EUV light generation controller 5 (S1300). Through this, the EUV light generation controller 5 may stop the output of the pulse laser beam from the laser apparatus 3. The signal indicating that laser irradiation is prohibited may remain active until a result of measuring the targets 27 is determined to be OK in S1800, which will be mentioned later.

Next, the target control unit 51 may set the parameters for the waveform of the electrical signal for generating the driving voltage applied to the vibrating element 60 to initial values (S1400). These initial values may be stored in advance in a storage memory 1005 (mentioned later). For example, the frequency fm of the second periodic function, the peak phase deviation δθ, the frequency fc of the first periodic function, and the phase difference φ between the first periodic function and the second periodic function may be set to the respective initial values indicated below.

fm=fm0=100 kHz
δθ=δθ0=100°
fc=fc0=900 kHz
φ=φ0=0°

Next, the target control unit 51 may send the parameters to the function generator 57 (S1500). Through this, the function generator 57 may generate an electrical signal having a waveform based on the parameters. The vibrating element power source 58 may then apply the driving voltage to the vibrating element 60 in accordance with the electrical signal outputted from the function generator 57. The jet 66 of the target material outputted from the nozzle opening 62 may then be detached in droplet form and turn into a plurality of the targets 27.

Next, the target control unit 51 may measure the targets (S1600). For example, the target control unit 51 may measure an interval D(n) between the targets 27. Details of this process will be given later with reference to FIG. 6.

Next, the target control unit 51 may determine a result of the measurement (S1700). For example, in the case where there is a small amount of variation in the intervals D(n) between the targets 27, the target control unit 51 may make a determination of "OK", whereas in the case where there is a large amount of variation in the intervals D (n) between the targets 27, the target control unit 51 may make a determination of "NG". Details of this process will be given later with reference to FIG. 8. After S1700, the target control unit 51 may advance the process to S1800.

In the case where the target control unit 51 has made a determination of "NG" in S1700 (S1800; NO), the process may advance to S1900.

In S1900, the target control unit 51 may determine whether or not all of the values of δθ, fc, and φ in the aforementioned parameters are at their maximum values. The maximum values will be described later with reference to FIG. 9.

In the case where at least one of the values of δθ, fc, and φ is not the maximum value in S1900 (S1900; NO), the target control unit 51 may change the values of δθ, fc, and φ in S2000. Details of the process of S2000 will be given later with reference to FIG. 9. After S2000, the target control unit 51 may return the process to the aforementioned S1500 and repeat the processes that follow thereafter. In other words, the target control unit 51 may send the values of δθ, fc, and φ changed in S2000 to the function generator 57 (S1500), and may once again measure the targets (S1600) and determine the measurement result (S1700).

In the case where all of the values of δθ, fc, and φ are the maximum values in S1900 (S1900; YES), the target control unit 51 may end the process of this flowchart having examined the values of all of the parameters to be changed. At this time, the target control unit 51 may output a signal indicating that parameters could not be set to the EUV light generation controller 5.

In the case where the target control unit 51 has made a determination of "OK" in S1700 (S1800; YES), the process may advance to S2100.

In S2100, the target control unit 51 may output a signal indicating that laser radiation is permitted to the EUV light generation controller 5. Through this, the EUV light genera-tion controller 5 may start the output of the pulse laser beam from the laser apparatus 3. The targets 27 may be irradiated with the pulse laser beam and EUV light may be outputted as a result. The signal indicating that laser radiation is permitted may remain active until "NG" is determined for a result of measuring the targets 27 in S2300, mentioned later, and the process branches to "NO" in S2400.

Next, the target control unit 51 may measure the targets (S2200). In other words, a determination of "OK" has been made in S1700 using the parameters sent to the function generator 57 in S1500, and thus the targets may be measured without changing those parameters. The process of S2200 may be the same as that in the aforementioned S1600. Details of this process will be given later with reference to FIG. 6.

Next, the target control unit 51 may determine a result of the measurement (S2300). The process of S2300 may be the same as that in the aforementioned S1700. Details of this process will be given later with reference to FIG. 8. After S2300, the target control unit 51 may advance the process to S2400.

In the case where the target control unit 51 has made a determination of "OK" in S2300 (S2400; YES), the process may return to S2200. In other words, the target control unit 51 may repeat the process for measuring the targets (S2200) and so on without changing the parameters.

In the case where the target control unit 51 has made a determination of "NG" in S2300 (S2400; NO), the process may return to S1300. In other words, the target control unit 51 may output the signal indicating that laser irradiation is prohibited to the EUV light generation controller 5 (S1300), and may repeat the process having set the parameters to their initial values (S1400).

4.5.2 Target Measurement Process (S1600/S2200)

Figure 6:
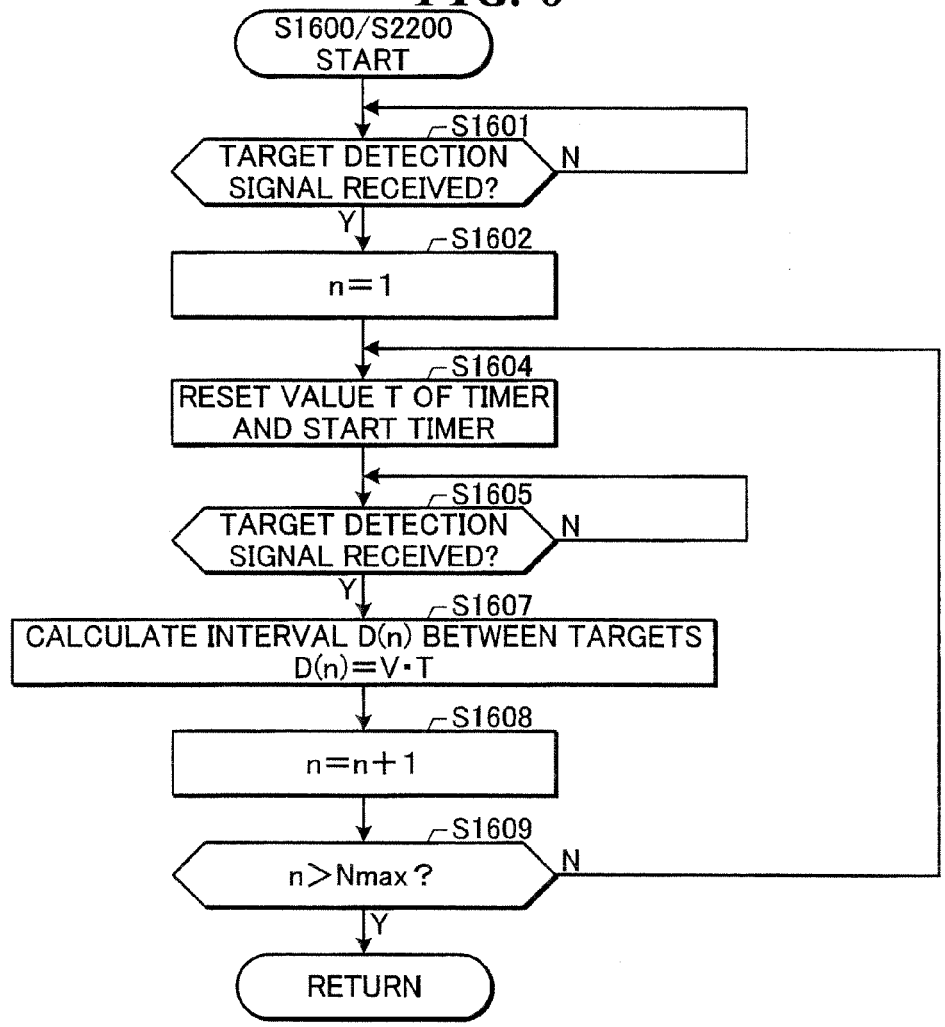
FIG. 6 is a flowchart illustrating a process for measuring targets indicated in FIG. 5.

FIG. 6 is a flowchart illustrating the process for measuring targets indicated in FIG. 5. The processes shown in FIG. 6 may be carried out by the target control unit 51 as a subroutine of S1600 and S2200 of FIG. 5.

First, the target control unit 51 may determine whether or not the target detection signal Vd has been received from the photodetector 41 (S1601). In the case where the target detection signal Vd has not been received (S1601; NO), the target control unit 51 may stand by until the target detection signal Vd is received. In the case where the target detection signal Vd has been received (S1601; YES), the target control unit 51 may advance the process to S1602.

In S1602, the target control unit 51 may set the value of a counter n to 1. As will be described later, the value of the counter n can specify individual pieces of sample data measured as the interval D(n) between the targets 27. The value of the counter n can be an integer in a range from 1 to a maximum value Nmax.

Next, the target control unit 51 may activate a timer 1003 (mentioned later) and start measuring time (S1604). In other words, the target control unit 51 may reset a value T of the timer 1003, serving as a variable that is incremented with the passage of time, to 0, and may start a process for incrementing the value T of the timer 1003 by a set number every set amount of time.

Next, the target control unit 51 may determine whether or not the target detection signal Vd has been received from the photodetector 41 (S1605). This process may be the same as that in the aforementioned S1601. In the case where the target detection signal Vd has been received (S1605; YES), the target control unit 51 may advance the process to S1607.

In S1607, the target control unit 51 may calculate the interval D(n) between the targets 27. The interval D(n) between the targets 27 may be calculated through the following formula.

$$D(n) = V \cdot T$$

Here, V may represent the velocity of the targets 27; a value stored in advance in the storage memory 1005 (mentioned later) may be used for the velocity V, or a value measured separately may be used for the velocity V. T may be the aforementioned value of the timer 1003, and may represent an amount of time from when the target detection signal Vd for a previous target is received to when the target detection signal Vd for the current target is received in S1605.

Next, the target control unit 51 may update the value of the counter n by adding 1 to the current value of the counter n (S1608).

Next, the target control unit 51 may determine whether or not the value of the counter n updated in S1608 has exceeded the maximum value Nmax (S1609).

In the case where the value of the counter n has not exceeded the maximum value Nmax (S1609; NO), the target control unit 51 may return the process to the aforementioned S1604. Through this, the value T of the timer 1003 may be reset and started once again (S1604), and the amount of time until the next target detection signal Vd is received may be measured.

In the case where the value of the counter n has exceeded the maximum value Nmax (S1609; YES), the target control unit 51 may end the process of this flowchart.

Through the aforementioned process, Nmax pieces of sample data, or in other words, D(1), D(2), ..., D(Nmax), can be measured as the intervals D(n) between the targets 27.

4.5.3 Measurement Result Evaluation Process (S1700/S2300)

Figure 7:
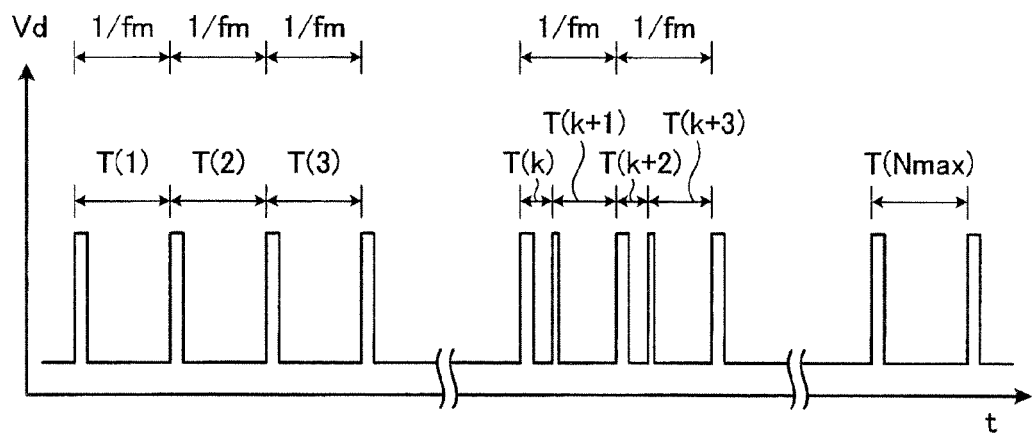
FIG. 7 is a timing chart illustrating an example of a target detection signal.

FIG. 7 is a timing chart illustrating an example of the target detection signal Vd. In FIG. 7, the horizontal axis represents time t and the vertical axis schematically represents an intensity of the target detection signal Vd. Each time a single target 27 passes through a region that can be detected by the target sensor 40, the target sensor 40 can output the target detection signal Vd in pulse form, as indicated in FIG. 7. Each time a pulse of the target detection signal Vd is outputted, the target control unit 51 can read the value T of the timer 1003 and calculate the interval D(n) between the targets 27 as described above (S1607). In FIG. 7, the values of the timer 1003 read in order to calculate D(1), D(2), ..., D(Nmax) are indicated by T(1), T(2), ..., T(Nmax), respectively.

In the case where the generation of the targets 27 is stable, the values T of the timer 1003 that have been read may be substantially the same, as indicated by T(1), T(2), and T(3). In this case, an average value of the values T of the timer 1003 that have been read may be substantially the same as the cycle of the second periodic function (1/fm).

On the other hand, in the case where the generation of the targets 27 is not stable, variation will appear in the values T of the timer 1003, as indicated by T(k), T(k+1), T(k+2), and T(k+3). Meanwhile, in the case where some of the plurality of fine droplets 67 that are to combine do not combine and fine droplets known as "satellites" remain, the value T of the timer 1003 will be a significantly lower value than the cycle of the second periodic function (1/fm), as indicated by T(k) and T(k+2).

Accordingly, the target control unit 51 may determine whether or not a result of measuring the targets 27 is within a permissible range, as will be described hereinafter.

Figure 8:
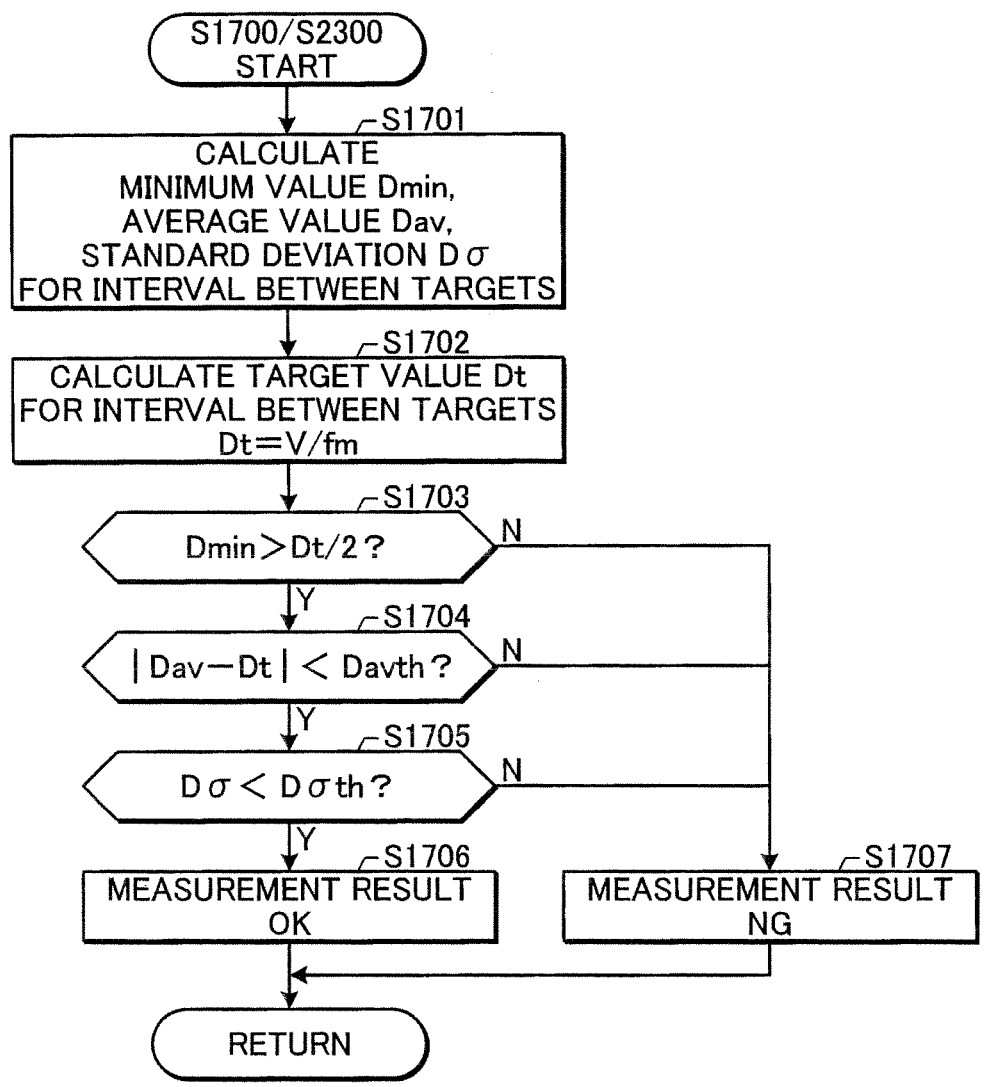
FIG. 8 is a flowchart illustrating a process for evaluating a measurement result indicated in FIG. 5.

FIG. 8 is a flowchart illustrating a process for evaluating the measurement result indicated in FIG. 5. The processes shown in FIG. 8 may be carried out by the target control unit 51 as a subroutine of S1700 and S2300 of FIG. 5.

First, the target control unit 51 may calculate the following values based on data of the interval D(n) between the targets 27 measured in S1600 or S2200 (S1701).
minimum value Dmin
average value Dav
standard deviation Dσ

Next, the target control unit 51 may calculate a target value Dt for the interval between the targets 27 through the following formula (S1702).

$$Dt = V/fm$$

Here, V represents the velocity of the targets 27, and may be the same value as that used in S1607 of FIG. 6. fm represents the frequency of the second periodic function, and may be the value set in S1400 of FIG. 5.

Next, the target control unit 51 may determine whether or not the minimum value Dmin of the interval between the targets 27 is greater than half the target value Dt of the interval between the targets 27 (S1703).

In the case where the minimum value Dmin is greater than half the target value Dt (S1703; YES), the target control unit 51 may advance the process to S1704.

In the case where the minimum value Dmin is less than or equal to half the target value Dt (S1703; NO), the target control unit 51 may advance the process to S1707. The minimum value Dmin being less than or equal to half the target value Dt may be thought of as indicating that some of the plurality of fine droplets 67 that are to combine have not combined.

In S1704, the target control unit 51 may determine whether or not the absolute value of a difference between the average value Dav of the interval between the targets 27 and the target value Dt of the interval between the targets 27 is less than a threshold Davth. A value stored in advance in the storage memory 1005 (mentioned later) may be used as the threshold Davth.

In the case where the absolute value of the difference between the average value Dav and the target value Dt is less than the threshold Davth (S1704; YES), the target control unit 51 may advance the process to S1705.

In the case where the absolute value of the difference between the average value Day and the target value Dt is greater than or equal to the threshold Davth (S1704; NO), the target control unit 51 may advance the process to S1707. The absolute value of the difference between the average value Dav and the target value Dt being greater than or equal to the threshold Davth may be thought of as indicating that the interval between the targets 27 has deviated from the target value Dt.

In S1705, the target control unit 51 may determine whether or not the standard deviation Dσ of the interval between the targets 27 is less than a threshold Dσth. A value stored in advance in the storage memory 1005 (mentioned later) may be used as the threshold Dσth.

In the case where the standard deviation Dσ is less than the threshold Dσth (S1705; YES), the target control unit 51 may advance the process to S1706.

In the case where the standard deviation Dσ is greater than or equal to the threshold Dσth (S1705; NO), the target control unit 51 may advance the process to S1707. The standard deviation Dσ being greater than or equal to the threshold Dσth may be thought of as indicating a high amount of variation in the intervals between the targets 27.

In S1706, the target control unit 51 may set a flag (not shown) indicating the measurement result to a first value, and may end the process of this flowchart. The first value may be used as a flag indicating that the measurement result is "OK" at the branch of S1800 or S2400 indicated in FIG. 5.

In S1707, the target control unit 51 may set a flag (not shown) indicating the measurement result to a second value, and may end the process of this flowchart. The second value may be used as a flag indicating that the measurement result is "NG" at the branch of S1800 or S2400 indicated in FIG. 5.

4.5.4 Parameter Changing Process (S2000)

Figure 9:
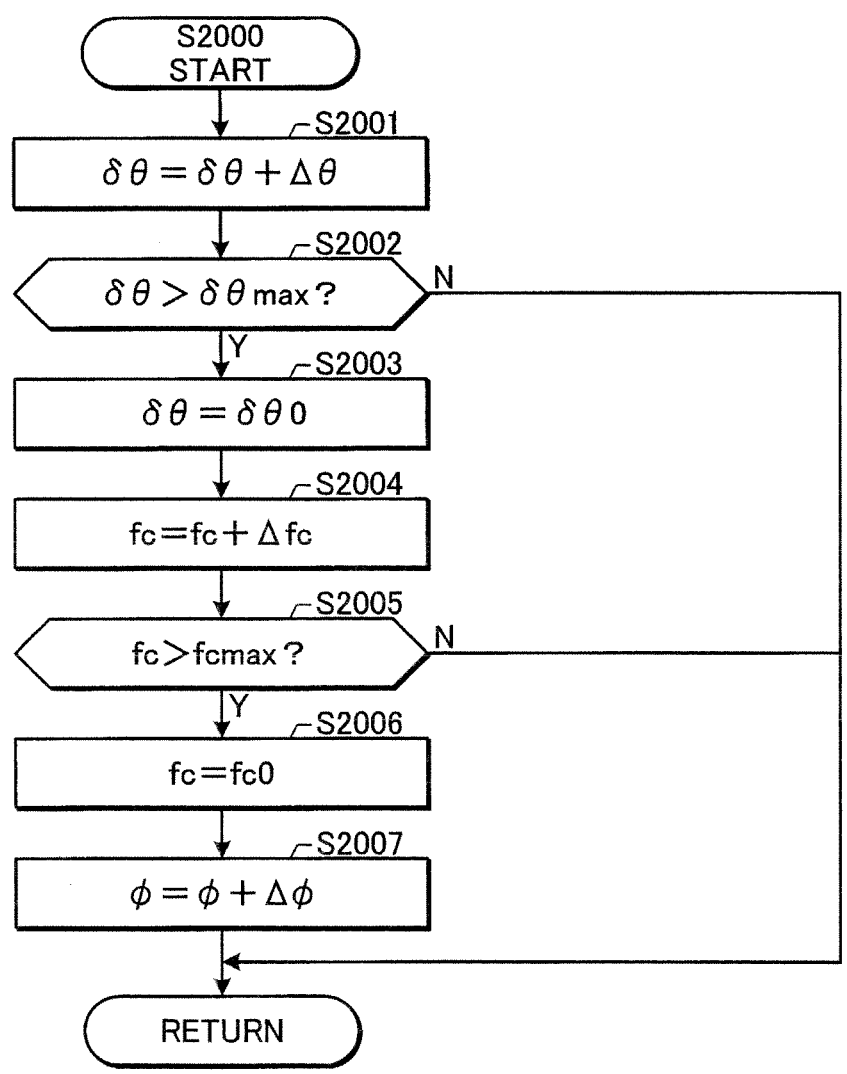
FIG. 9 is a flowchart illustrating a process for changing parameters indicated in FIG. 5.

FIG. 9 is a flowchart illustrating the process for changing parameters indicated in FIG. 5. The processes shown in FIG. 9 may be carried out by the target control unit 51 as a subroutine of S2000 of FIG. 5. In FIG. 9, it is desirable for δθ to be any one of $N_\theta$ values from the initial value δθ0 to a maximum value δθmax. It is desirable for fc to be any one of $N_{fc}$ values from the initial value fc0 to a maximum value fcmax. It is desirable for φ to be any one of $N_\phi$ values from the initial value φ0 to a maximum value φmax. The target control unit 51 may examine all combinations of the values of δθ, fc, and φ, indicated by ($N_\theta \times N_{fc} \times N_\phi$), through the aforementioned process.

The maximum values of the parameters may be the values indicated below, for example. These values may be stored in advance in the storage memory 1005 (mentioned later).

δθmax=180°
fcmax=1600 kHz
φmax=180°

First, the target control unit 51 may change the value of the peak phase deviation δθ by adding a predetermined value Δθ to the current value of the peak phase deviation 59 (S2001). Δθ may be the following value.

$$\Delta\theta = (\delta\theta max - \delta\theta 0)/(N_\theta - 1)$$

Next, the target control unit 51 may determine whether or not the new value of the peak phase deviation δθ exceeds the maximum value δθmax (S2002).

In the case where the new value of the peak phase deviation δθ does not exceed the maximum value δθmax in S2002 (S2002; NO), the target control unit 51 may end the process of this flowchart.

Then, the new value of the peak phase deviation δθ may be sent to the function generator 57 (S1500) and the processes for measuring the targets (S1600) and so on may then be carried out as indicated in FIG. 5.

Processes such as changing the value of the peak phase deviation δθ (S2001), measuring the targets after the change (S1600 in FIG. 5), and so on may be repeated thereafter as well. This repetition may be carried out until the new value of the peak phase deviation δθ reaches the maximum value δθmax. However, in the case where the measurement result has been determined to be "OK" in S1700 of FIG. 5, the parameters may not be changed thereafter. In the case where the measurement result is not determined to be "OK" in S1700 even after the new value of the peak phase deviation δθ has reached the maximum value δθmax, the value of the peak phase deviation δθ may be changed again in S2001 and the determination of S2002 may be carried out.

In the case where the new value of the peak phase deviation δθ exceeds the maximum value δθmax in S2002 (S2002; YES), the target control unit 51 may return the value of the peak phase deviation δθ to the initial value δθ0 (S2003).

Next, the target control unit 51 may change the value of the frequency fc by adding a predetermined value Δfc to the current value of the frequency fc of the first periodic function (S2004). Δf may be the following value.

$$\Delta f = (fcmax - fc0)/(N_{fc} - 1)$$

Next, the target control unit 51 may determine whether or not the new value of the frequency fc exceeds the maximum value fcmax (S2005).

In the case where the new value of the frequency fc does not exceed the maximum value fcmax in S2005 (S2005; NO), the target control unit 51 may end the process of this flowchart.

Then, the initial value δθ0 of the peak phase deviation and the new value of the frequency fc may be sent to the function generator 57 (S1500) and the processes for measuring the targets (S1600) and so on may then be carried out as indicated in FIG. 5.

Processes such as changing the value of the peak phase deviation δθ (S2001), measuring the targets after the change (S1600 in FIG. 5), and so on may be repeated thereafter as well. This repetition may be carried out until the new value of the peak phase deviation δθ reaches the maximum value δθmax. However, in the case where the measurement result has been determined to be "OK" in S1700 of FIG. 5, the parameters may not be changed thereafter.

In the case where the new value of the peak phase deviation δθ once again exceeds the maximum value δθmax in S2002 (S2002; YES), the target control unit 51 may once again return the value of the peak phase deviation δθ to the initial value δθ0 (S2003) and may change the value of the frequency fc (S2004).

In this manner, the target control unit 51 may repeat the processes of S2003 and S2004 each time the new value of the peak phase deviation δθ exceeds the maximum value δθmax. This repetition may be carried out until both the new value of the frequency fc and the new value of the peak phase deviation δθ reach their respective maximum values. In the case where the measurement result is not determined to be "OK" in S1800 even after the new value of the frequency fc and the new value of the peak phase deviation δθ have reached their respective maximum values, the value of the frequency fc may be changed again in S2004 and the determination of S2005 may be carried out.

In the case where the new value of the frequency fc exceeds the maximum value fcmax in S2005 (S2005; YES), the target control unit 51 may return the value of the frequency fc to the initial value fc0 (S2006).

Next, the target control unit 51 may change the value of the phase difference φ by adding a predetermined value Δφ to the current value of the phase difference p between the first periodic function and the second periodic function (S2007) and may end the process of this flowchart. Δφ may be the following value.

$$\Delta\phi = (\phi max - \phi 0)/(N_\phi - 1)$$

Then, the initial value δθ0 of the peak phase deviation, the initial value fc0 of the frequency of the first periodic function, and the new value of the phase difference φ may be sent to the function generator 57 (S1500) and the processes for measuring the targets (S1600) and so on may then be carried out as indicated in FIG. 5.

Processes such as changing the value of the peak phase deviation δθ (S2001), changing the value of the frequency fc (S2004), measuring the targets after the individual changes (S1600 in FIG. 5), and so on may be repeated thereafter as well. This repetition may be carried out until both the new value of the frequency fc and the new value of the peak phase deviation δθ reach their respective maximum values. However, in the case where the measurement result has been determined to be "OK" in S1700 of FIG. 5, the parameters may not be changed thereafter.

In the case where the new value of the frequency fc once again exceeds the maximum value fcmax in S2005 (S2005; YES), the target control unit 51 may once again return the value of the frequency fc to the initial value fc0 (S2006) and change the value of the phase difference φ (S2007).

In this manner, the target control unit 51 may repeat the processes of S2006 and S2007 each time the new value of the frequency fc exceeds the maximum value fcmax. This repetition may be carried out until the new value of the phase difference φ, the new value of the frequency fc, and the new value of the peak phase deviation δθ reach their respective maximum values. In the case where the measurement result is not determined to be "OK" in S1700 even after the values of δθ, fc, and φ have reached their respective maximum values, the target control unit 51 may end the process of the flowchart shown in FIG. 5 through the process of S1900 indicated in FIG. 5.

5. Target Supply Device Including Image Sensor
5.1 Configuration

Figure 10:
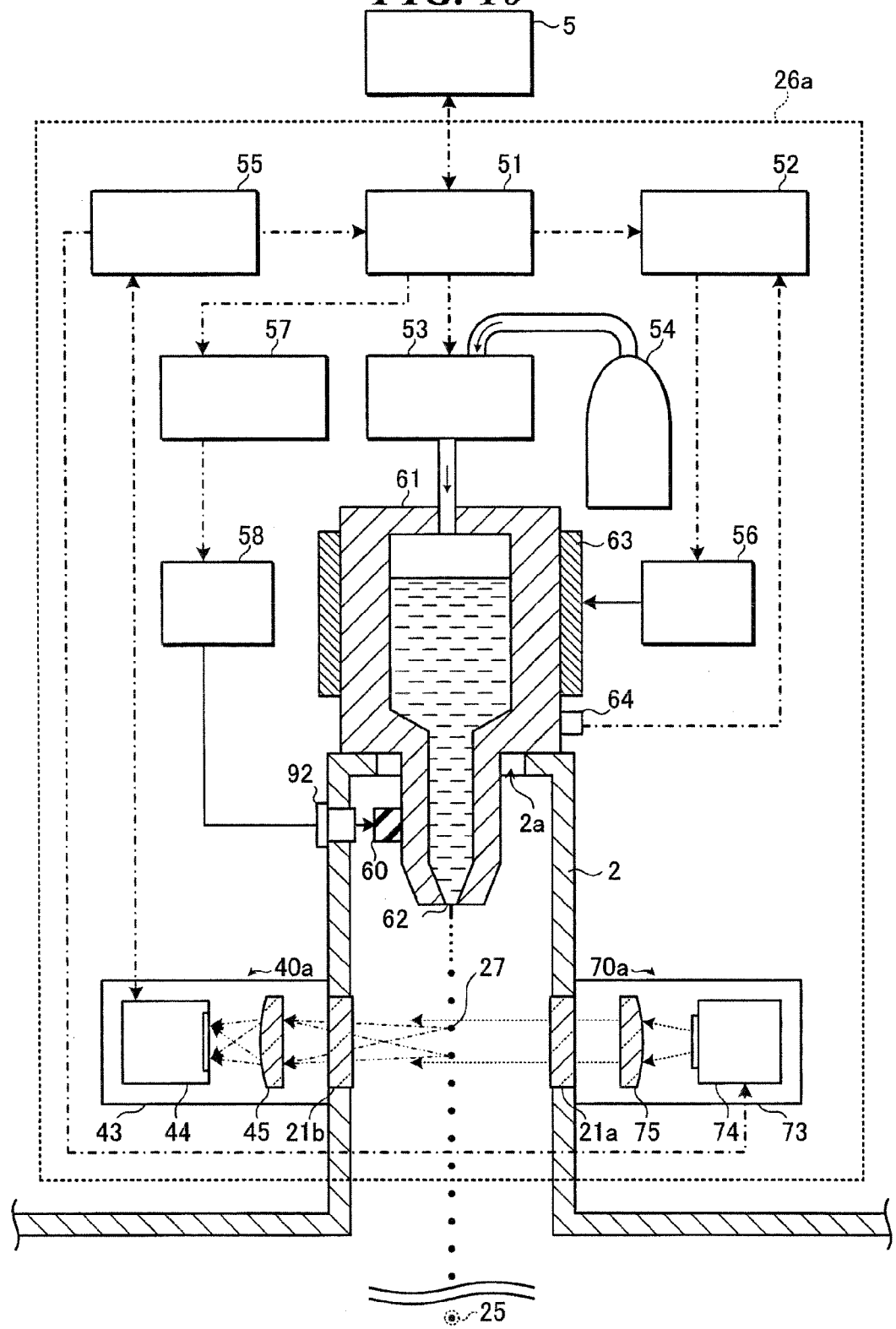
FIG. 10 is a partial cross-sectional view illustrating the configuration of a target supply device according to a second embodiment.

FIG. 10 is a partial cross-sectional view illustrating the configuration of a target supply device 26a according to a second embodiment. The target supply device 26a according to the second embodiment may differ from that of the first embodiment in that a target sensor 40a may include an image sensor 44 instead of the photodetector 41 shown in FIG. 2. The target sensor 40a may include a transfer optical system 45 instead of the light-receiving optical system 42 shown in FIG. 2. A light-emitting section 70a may include a flash lamp 74 instead of the light source 71 shown in FIG. 2. The light-emitting section 70a may include a collimator 75 instead of the illuminating optical system 72 shown in FIG. 2. The target supply device according to the second embodiment may further include a target interval measurement unit 55.

The image sensor 44 and the flash lamp 74 may be connected to the target interval measurement unit 55 via respective signal lines. The target interval measurement unit 55 may be connected to the target control unit 51 via a signal line. The image sensor 44 may include a shutter (not shown), and the shutter may be configured to open and close in response to control signals. The image sensor 44 may capture an image while the shutter is open. The shutter may be an electronic shutter or a mechanical shutter.

5.2 Operation

The flash lamp 74 may emit light in pulses in accordance with a control signal outputted by the target interval measurement unit 55. The emitted light in pulses may be a single pulse for a single instance of the control signal. Meanwhile, the time for which a pulse of light is emitted may be shorter than, for example, an amount of time required for the target 27 at the velocity V to move a distance equal to the diameter of the target 27. For example, in the case where the velocity V of the targets 27 is 50 m/s and the diameter of the targets 27 is 6 μm, the time for which the flash lamp 74 emits a single pulse of light may be approximately 10 ns to 100 ns.

The collimator 75 may allow the light outputted from the flash lamp 74 to pass therethrough and may convert that light into parallel light. As a result, the light-emitting section 70a may irradiate a predetermined position in the trajectory of the targets 27 and the periphery of that position with pulses of parallel light via the window 21a. It is desirable for an irradiation range of the light to be of a size that enables a plurality of the targets 27 to enter the irradiation range at the same time.

The transfer optical system 45 may form an image of the target 27 that passes through the optical path of the light emitted by the light-emitting section 70a at a position of a light-receiving unit of the image sensor 44. It is desirable for the transfer optical system 45 to be configured so that a plurality of images of the targets 27 are formed on the light-receiving unit of the image sensor 44 at the same time. The image sensor 44 may capture a still image of a plurality of moving targets 27 while irradiating the targets 27 using the light-emitting section 70a and form image data as a result. The image sensor 44 may output the image data to the target interval measurement unit 55 as a target detection signal. The image data may be data of an optical intensity distribution in the image formed at the position of the light-receiving unit of the image sensor 44.

The target interval measurement unit 55 may obtain the image data outputted by the image sensor 44 and calculate the interval D(n) between the targets 27 from the image data. The target interval measurement unit 55 may send data indicating the calculated interval D(n) between the targets 27 to the target control unit 51.

5.3 Target Measurement Process

Figure 11:
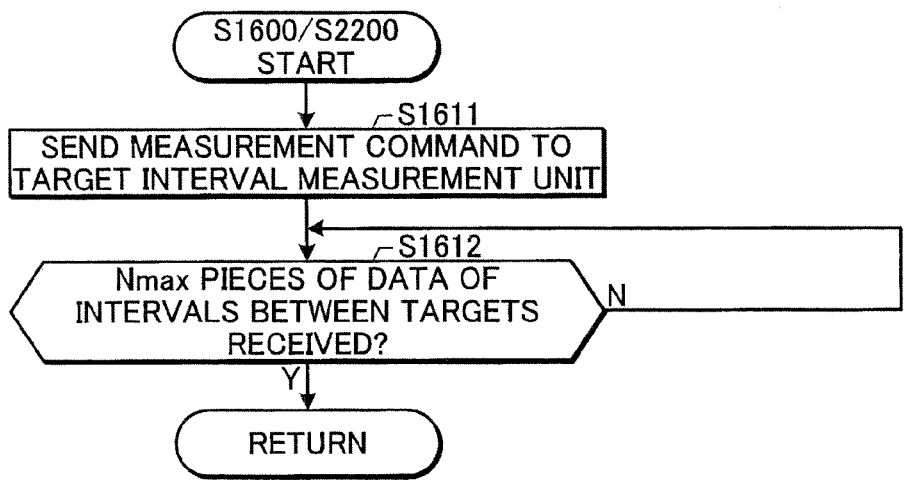
FIG. 11 is a flowchart illustrating a process for measuring targets performed by a target control unit indicated in FIG. 10.

FIG. 11 is a flowchart illustrating a process for measuring targets performed by the target control unit 51, indicated in FIG. 10. The target control unit 51 may carryout the same processes as those described in the first embodiment with reference to FIGS. 5, 8, and 9, with the exception of the process for measuring the targets (S1600 or S2200). The processes shown in FIG. 11 may be carried out as a subroutine of S1600 and S2200 of FIG. 5.

As shown in FIG. 11, the target control unit 51 may send a target measurement command to the target interval measurement unit 55 (S1611). The target measurement command may include information specifying the number of pieces of sample data for the interval D(n) between the targets 27. The number of pieces of sample data may be Nmax, for example.

Then, the target control unit 51 may determine whether or not Nmax pieces of sample data have been received from the target interval measurement unit 55 as the data of the interval D (n) between the targets 27 (S1612). In the case where the data of the interval D(n) between the targets 27 has not been received (S1612; NO), the target control unit 51 may stand by until that data is received. In the case where the data of the interval D(n) between the targets 27 has been received (S1612; YES), the target control unit 51 may end the process of this flowchart.

Figure 12:
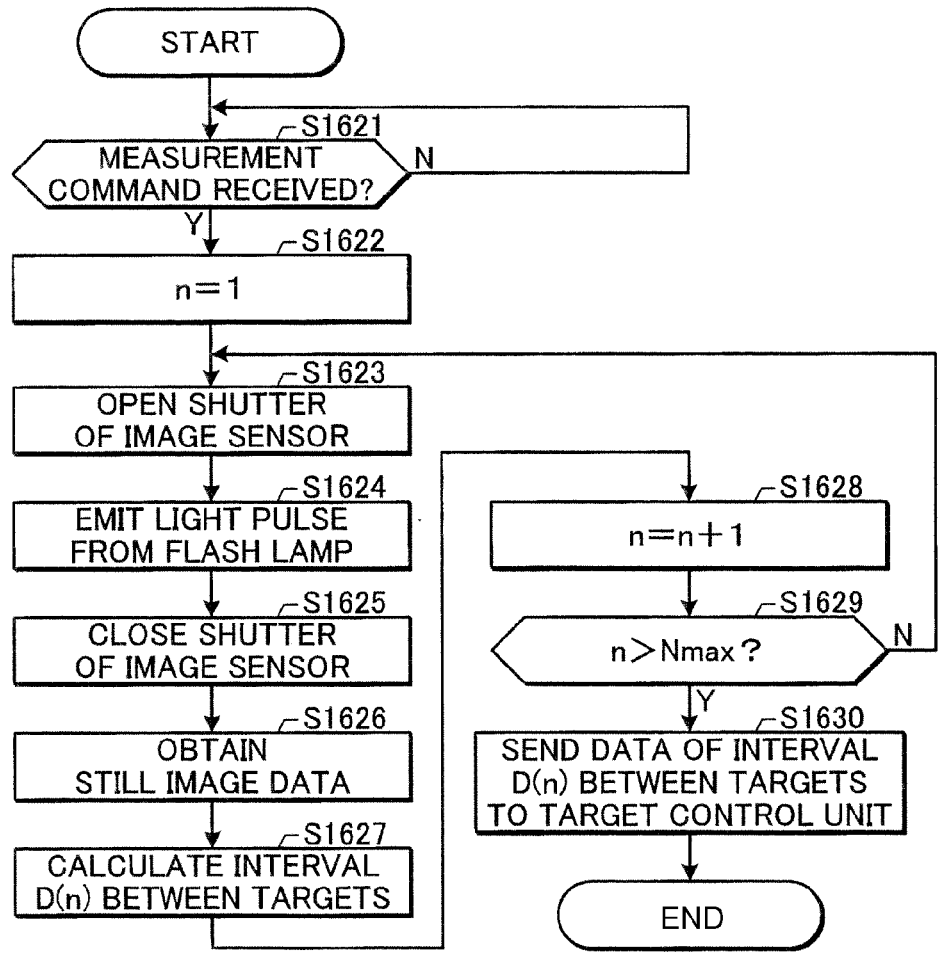
FIG. 12 is a flowchart illustrating an example of a process performed by a target interval measurement unit.

FIG. 12 is a flowchart illustrating an example of a process performed by the target interval measurement unit 55. The target interval measurement unit 55 may measure the interval D (n) between the targets 27 as described hereinafter.

First, the target interval measurement unit 55 may determine whether or not the measurement command for the targets 27 has been received from the target control unit 51 (S1621). In the case where the measurement command for the targets 27 has not been received (S1621; NO), the target interval measurement unit 55 may stand by until the measurement command is received. In the case where the measurement command for the targets 27 has been received (S1621; YES), the target interval measurement unit 55 may advance the process to S1622.

In S1622, the target interval measurement unit 55 may set the value of the counter n to 1. As will be described later, the value of the counter n can specify individual pieces of sample data measured as the interval D(n) between the targets 27. The value of the counter n can be an integer in a range from 1 to the maximum value Nmax.

Next, the target interval measurement unit 55 may send, to the image sensor 44, a control signal for causing the shutter (not shown) to open (S1623). The shutter of the image sensor 44 may open as a result.

Next, the target interval measurement unit 55 may send, to the flash lamp 74, a control signal for causing the flash lamp 74 to emit light in pulses (S1624). The flash lamp 74 may emit light in pulses as a result.

Next, the target interval measurement unit 55 may send, to the image sensor 44, a control signal for causing the shutter to close (S1625). The shutter of the image sensor 44 may close as a result.

Next, the target interval measurement unit 55 may obtain the image data from the image sensor 44 (S1626).

Next, the target interval measurement unit 55 may calculate the interval D(n) between the targets 27 from the image data (S1627). For example, the target interval measurement unit 55 may extract an image of a plurality of the targets 27 from the image data, detect positions of the images of the plurality of targets 27 in a two-dimensional plane, and calculate an interval between the images in the two-dimensional plane. The interval D(n) between the targets 27 may then be calculated by multiplying the interval in the two-dimensional plane by a magnification rate of the transfer optical system 45.

Next, the target interval measurement unit 55 may update the value of the counter n by adding 1 to the current value of the counter n (S1628).

Next, the target interval measurement unit 55 may determine whether or not the value of the counter n updated in S1628 has exceeded the maximum value Nmax (S1629).

In the case where the value of the counter n has not exceeded the maximum value Nmax (S1629; NO), the target interval measurement unit 55 may return the process to the aforementioned S1623. Through this, the next image data may be obtained from the image sensor 44 and the interval between another plurality of the targets 27 may be calculated.

In the case where the value of the counter n has exceeded the maximum value Nmax (S1629; YES), the target interval measurement unit 55 may send the data of the interval D(n) between the targets 27 to the target control unit 51, and may end the process of this flowchart (S1630). Through the aforementioned process, Nmax pieces of sample data, or in other words, D(1), D(2), . . . , D(Nmax), can be measured as the intervals D(n) between the targets 27.

The configuration may be the same as that described in the first embodiment in other respects.

6. Waveform and Parameter Examples

FIGS. 13A to 13D, 14, and 15 are graphs illustrating several examples of waveforms that can be used in the target supply device 26 or 26a according to the present disclosure. As will be described hereinafter, the targets 27 can be generated in a stable manner even in the case where the frequency fc of the first periodic function Vc(t) serving as the carrier wave and the frequency fm of the second periodic function Vm(t) serving as the modulated wave are equal. As described with reference to FIGS. 4A and 4C, the frequency fm may be lower than the frequency fc, or may be the same.

The following trigonometric function is used as the first periodic function Vc(t) in all of the examples shown in FIGS. 13A to 13D, 14, and 15.

$$Vc(t)=Vcm \cdot \sin(2\pi \cdot fc \cdot t)$$

The modulated wave Vpm(t) is generated through phase modulation expressed by the following formula in all of the examples shown in FIGS. 13A to 13D, 14, and 15.

$$Vpm(t)=Vcm \cdot \sin\{2\pi \cdot fc \cdot t + \delta\theta \cdot Vm(t) + \phi\}$$

The following trigonometric function is used as the second periodic function Vm(t) in the examples shown in FIGS. 13A to 13D.

$$Vm(t)=\cos(2\pi \cdot fm \cdot t)$$

fm=fc=100 kHz in the examples shown in FIGS. 13A to 13D. Furthermore, the second periodic function Vm(t) is indicated by a broken line in the examples shown in FIGS. 13A to 13D.

Figure 13A:
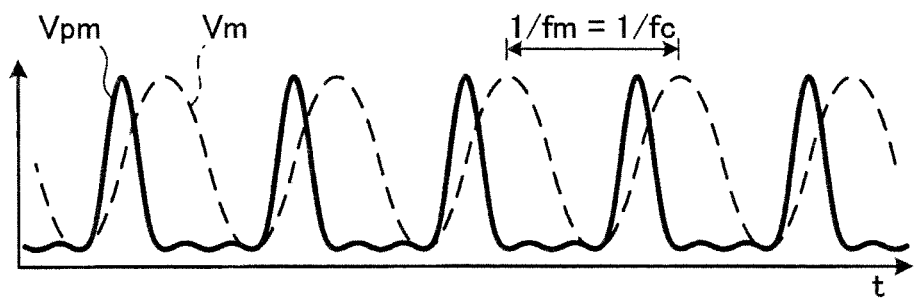
FIGS. 13A to 13D are graphs illustrating several examples of waveforms that can be used in a target supply device according to the present disclosure.

In FIG. 13A, the peak phase deviation $\delta\theta$ and the phase difference $\phi$ are set to the following values.

$\delta\theta=\pi/2$ $\phi=\pi$

A waveform such as that indicated by the solid line in FIG. 13A is obtained by setting the parameters in this manner. The targets 27 are generated in a stable manner by applying a driving voltage having this waveform to the vibrating element 60.

Figure 13B:
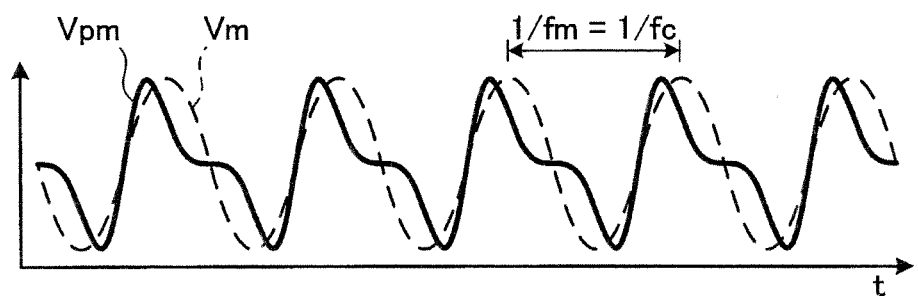

In FIG. 13B, the peak phase deviation $\delta\theta$ and the phase difference $\phi$ are set to the following values.

$\delta\theta=\pi/3$ $\phi=\pi/2$

A waveform such as that indicated by the solid line in FIG. 13B is obtained by setting the parameters in this manner. The targets 27 are generated in a stable manner by applying a driving voltage having this waveform to the vibrating element 60.

Figure 13C:
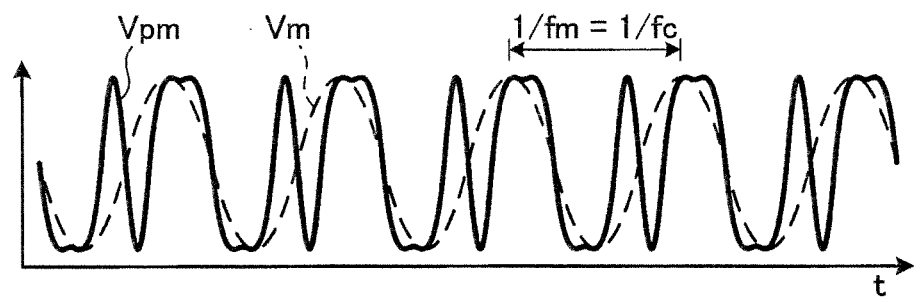

In FIG. 13C, the peak phase deviation $\delta\theta$ and the phase difference $\phi$ are set to the following values.

$\delta\theta=\pi$ $\phi=3\pi/2$

A waveform such as that indicated by the solid line in FIG. 13C is obtained by setting the parameters in this manner. The targets 27 are generated in a stable manner by applying a driving voltage having this waveform to the vibrating element 60.

Figure 13D:
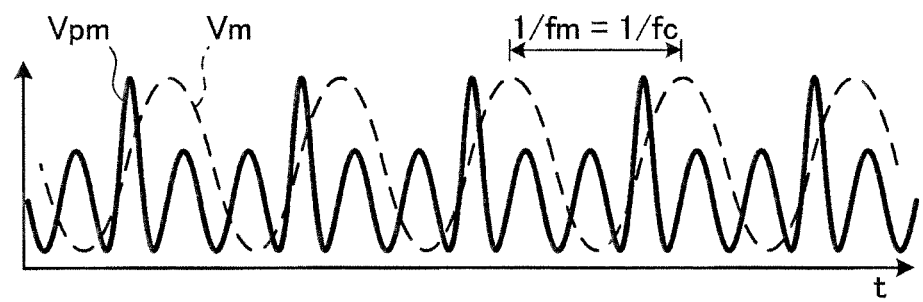

In FIG. 13D, the peak phase deviation $\delta\theta$ and the phase difference $\phi$ are set to the following values.

$\delta\theta=\pi$ $\phi=\pi$

A waveform such as that indicated by the solid line in FIG. 13D is obtained by setting the parameters in this manner. The targets 27 are generated in a stable manner by applying a driving voltage having this waveform to the vibrating element 60.

Figure 14:
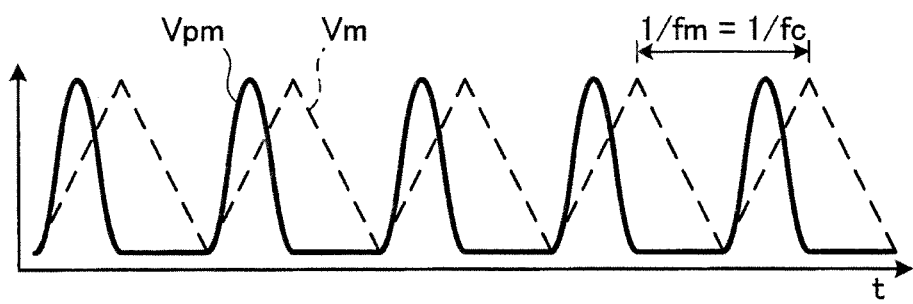
FIG. 14 is a graph illustrating another example of a waveform that can be used in a target supply device according to the present disclosure.

The following triangular wave function is used as the second periodic function Vm(t) in the example shown in FIG. 14.

$$Vm(t)=(8/\pi)\Sigma\{1/n^2 \cdot \sin(n\pi/2) \cdot \sin(n \cdot 2\pi \cdot fm \cdot t)\}$$

fm=fc=100 kHz in the example shown in FIG. 14. Furthermore, the second periodic function Vm(t) is indicated by a broken line in the example shown in FIG. 14.

In FIG. 14, the peak phase deviation $\delta\theta$ and the phase difference $\phi$ are set to the following values.

$\delta\theta=\pi/2$ $\phi=\pi/2$

A waveform such as that indicated by the solid line in FIG. 14 is obtained by setting the parameters in this manner. The targets 27 are generated in a stable manner by applying a driving voltage having this waveform to the vibrating element 60.

Figure 15:
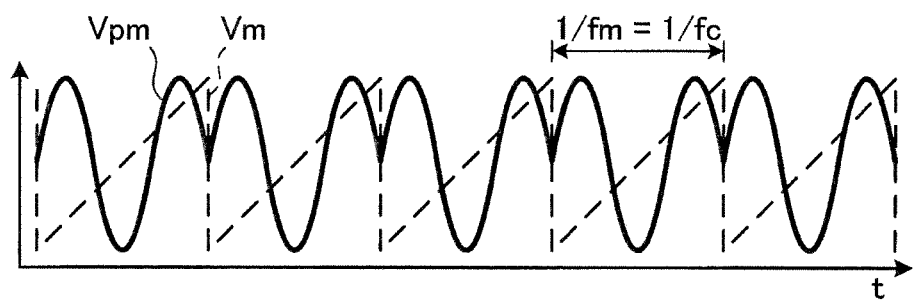
FIG. 15 is a graph illustrating yet another example of a waveform that can be used in a target supply device according to the present disclosure.

The following sawtooth wave function is used as the second periodic function Vm(t) in the example shown in FIG. 15.

$$Vm(t)=(1/3)\Sigma\{(-1)^{n+1} \cdot (2/n) \cdot \sin(n \cdot 2\pi \cdot fm \cdot t)\}$$

fm=fc=100 kHz in the example shown in FIG. 15. Furthermore, the second periodic function Vm(t) is indicated by a broken line in the example shown in FIG. 15.

In FIG. 15, the peak phase deviation δθ and the phase difference φ are set to the following values.

δθ=π/2
φ=3π/2

A waveform such as that indicated by the solid line in FIG. 15 is obtained by setting the parameters in this manner. The targets 27 are generated in a stable manner by applying a driving voltage having this waveform to the vibrating element 60.

7. Configuration of Controller

Figure 16:
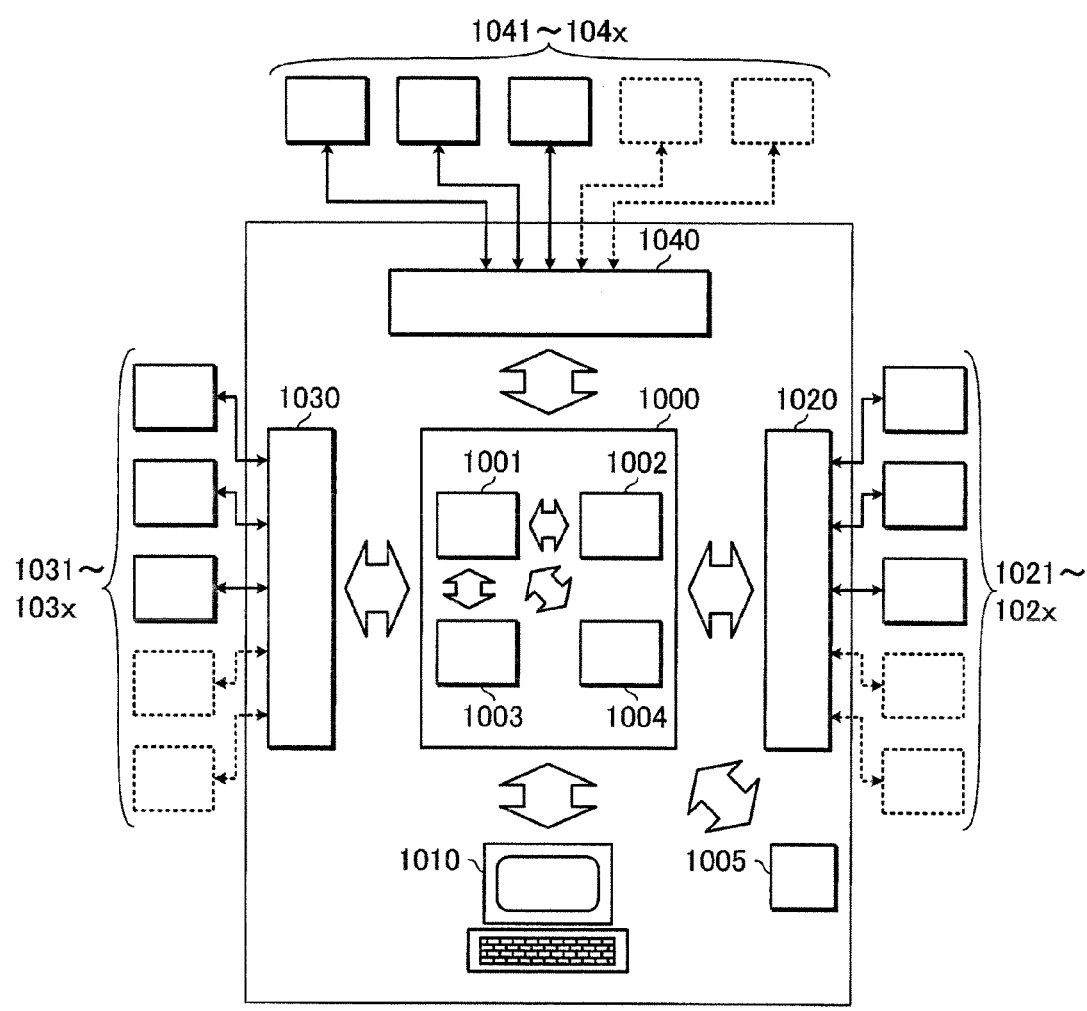
FIG. 16 is a block diagram illustrating the overall configuration of a controller.

FIG. 16 is a block diagram illustrating the overall configuration of a controller.

A controller of the target control unit 51, the target interval measurement unit 55, and so on in the aforementioned embodiments may be configured of a generic control device such as a computer, a programmable controller, or the like. The controller may be configured as follows, for example.

Configuration

The controller may be configured of a processing unit 1000 and the storage memory 1005, a user interface 1010, a parallel I/O controller 1020, a serial I/O controller 1030, and an A/D-D/A converter 1040 that are connected to the processing unit 1000. The processing unit 1000 may be configured of a CPU 1001 and a memory 1002, the timer 1003, and a GPU 1004 that are connected to the CPU 1001.

Operation

The processing unit 1000 may read out a program stored in the storage memory 1005. In addition, the processing unit 1000 may execute the read-out program and read out data from the storage memory 1005, store data in the storage memory 1005, and so on in accordance with the execution of the program.

The parallel I/O controller 1020 may be connected to communicable devices 1021 to 102x via a parallel I/O port. The parallel I/O controller 1020 may control digital signal communication, carried out during the execution of the program by the processing unit 1000, via the parallel I/O port.

The serial I/O controller 1030 may be connected to communicable devices 1031 to 103x via a serial I/O port. The serial I/O controller 1030 may control digital signal communication, carried out during the execution of the program by the processing unit 1000, via the serial I/O port.

The A/D-D/A converter 1040 may be connected to communicable devices 1041 to 104x via an analog port. The A/D-D/A converter 1040 may control analog signal communication, carried out during the execution of the program by the processing unit 1000, via the analog port.

The user interface 1010 may be configured to display the progress of the execution of the program by the processing unit 1000 to an operator, allow the operator to stop the program execution, cause the processing unit 1000 to execute interrupt processes, and so on.

The CPU 1001 of the processing unit 1000 may carry out computational processes for the program. The memory 1002 may temporarily store the program, temporarily store data during computations, and so on as the CPU 1001 is executing the program. The timer 1003 may measure a current time, an amount of elapsed time, and so on, and output the current time, the amount of elapsed time, and so on to the CPU 1001 in accordance with the execution of the program. When image data is inputted into the processing unit 1000, the GPU 1004 may process the image data in accordance with the execution of the program, and may output a result thereof to the CPU 1001.

The communicable devices 1021 to 102x connected to the parallel I/O controller 1020 via the parallel I/O port may be the EUV light generation controller 5, the temperature control unit 52, another controller, and the like.

The communicable devices 1031 to 103x connected to the serial I/O controller 1030 via the serial I/O port may be the pressure adjuster 53, the function generator 57, the light source 71, the flash lamp 74, and the like.

The communicable devices 1041 to 104x connected to the A/D-D/A converter 1040 via the analog port may be various types of sensors such as the photodetector 41 and the like.

By being configured as described thus far, the controller can execute the operations indicated in the respective flowcharts.

The above-described embodiments and the modifications thereof are merely examples for implementing the present disclosure, and the present disclosure is not limited thereto. Making various modifications according to the specifications or the like is within the scope of the present disclosure, and other various embodiments are possible within the scope of the present disclosure. For example, the modifications illustrated for particular ones of the embodiments can be applied to other embodiments as well (including the other embodiments described herein).

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the modifier "one (a/an)" should be interpreted as "at least one" or "one or more."

What is claimed is:

1. A target supply device comprising:
   a reservoir configured to hold a target material in a reservoir interior in a liquid form;
   a target sensor configured to detect droplets of the target material outputted from the reservoir; and
   a control unit configured to determine a standard deviation of an interval between the droplets, and to determine whether the standard deviation is less than a redetermined threshold;
   wherein the control unit permits laser radiation only if the standard deviation is less than the predetermined threshold.

2. The target supply device of claim 1, wherein the control unit is configured to determine a minimum distance between droplets, and the control unit ermits laser radiation only if the minimum distance is greater than one half of a target value and only if the standard deviation is less than the predetermined threshold.

3. The target supply device of claim 2, wherein the control unit determines the target value by the equation $Dt = V/fm$, wherein V is the velocity of the droplets and fm is a frequency of a second periodic function $Vm(t)$.

4. The target supply device of claim 1, wherein the control unit is configured to determine an average value Dav of the plurality of intervals and to determine an absolute value of a difference between the average value Dav and a target value, and wherein the control unit permits laser radiation only if the absolute value of the difference is less than a predetermined average value threshold Davth and only if the standard deviation is less than the predetermined threshold.

5. The target supply device of claim 4, wherein the control unit determines the target value by the equation $Dt = V/fm$, wherein V is the velocity of the droplets and fm is a frequency of a second periodic function $Vm(t)$.

6. A target supply device comprising:
   a reservoir configured to hold a target material in a reservoir interior in a liquid form;
   a vibrating element configured to apply vibrations to the reservoir;
   a target sensor configured to detect droplets of the target material outputted from the reservoir;
   a control unit configured to determine a standard deviation of a plurality of intervals between the droplets, and to determine whether the standard deviation is less than a predetermined threshold;
   a function generator configured to generate an electrical signal; and
   a power source configured to apply a driving voltage to the vibrating element in accordance with the electrical signal only when the standard deviation is less than the redetermined threshold.

7. The target supply device of claim 6, wherein the control unit permits laser radiation only if the standard deviation is less than the predetermined threshold.

8. The target supply device of claim 6, wherein the control unit is configured to determine a minimum distance between droplets, and the control unit permits laser radiation only if the minimum distance is greater than one half of a target value and only if the standard deviation is less than the predetermined threshold.

9. The target supply device of claim 8, wherein the control unit determines the target value by the equation $Dt = V/fm$, wherein V is the velocity of the droplets and fm is a frequency of a second periodic function $Vm(t)$.

10. The target supply device of claim 6, wherein the control unit is configured to determine an average value Dav of the plurality of intervals and to determine an absolute value of a difference between the average value Dav and a target value, and wherein the control unit permits laser radiation only if the absolute value of the difference is less than a predetermined average value threshold Davth and only if the standard deviation is less than the predetermined threshold.

11. The target supply device of claim 10, wherein the control unit determines the target value by the equation $Dt = V/fm$, wherein V is the velocity of the droplets and fm is a frequency of a second periodic function $Vm(t)$.

12. A target supply device comprising:
   a reservoir configured to hold a target material in a reservoir interior in a liquid form;
   a target sensor configured to detect droplets of the target material outputted from the reservoir; and
   a control unit configured to determine a standard deviation of an interval between the droplets, and to determine whether the standard deviation is at a redetermined value;
   wherein the control unit permits laser radiation only when the standard deviation is at the predetermined value.

13. The target supply device of claim 12, wherein the control unit is configured to determine a minimum distance between droplets, and the control unit ermits laser radiation only if the minimum distance is greater than one half of a target value and only if the standard deviation is at the predetermined value.

14. The target supply device of claim 13, wherein the control unit determines the target value by the equation $Dt = V/fm$, wherein V is the velocity of the droplets and fm is a frequency of a second periodic function $Vm(t)$.

15. The target supply device of claim 12, wherein the control unit is configured to determine an average value Dav of the plurality of intervals and to determine an absolute value of a difference between the average value Dav and a target value, and wherein the control unit permits laser radiation only if the absolute value of the difference is less than a predetermined average value threshold Davth and only if the standard deviation is at the predetermined value.

16. The target supply device of claim 15, wherein the control unit determines the target value by the equation $Dt = V/fm$, wherein V is the velocity of the droplets and fm is a frequency of a second periodic function $Vm(t)$.

17. The target supply device of claim 12, wherein the target sensor includes a photodetector, and the photodetector detects passage of one of the droplets based on changes in volume of light received by the photodetector.

18. The target supply device of claim 17, wherein the control unit calculates an interval between the one of the droplets and a next one of the droplets based on (i) a velocity of the droplets, (ii) a timing of the passage of the one of the droplets, and (iii) another timing of passage of the next one of the droplets.

19. The target supply device of claim 12, wherein the target sensor includes an image sensor, and the image sensor captures an image of two of the droplets.

20. The target supply device of claim 19, wherein the control unit calculates an interval between the two of the droplets based on the image captured by the image sensor.

* * * * *